(12) United States Patent
Harmon

(10) Patent No.: US 9,768,211 B2
(45) Date of Patent: Sep. 19, 2017

(54) INTEGRATED AVALANCHE PHOTODIODE ARRAYS

(71) Applicant: LightSpin Technologies, Inc., Endicott, NY (US)

(72) Inventor: Eric Harmon, Norfolk, MA (US)

(73) Assignee: LightSpin Technologies Inc., Endicott, NY (US)

( * ) Notice: Subject to any disclaimer, the term of this patent is extended or adjusted under 35 U.S.C. 154(b) by 170 days.

(21) Appl. No.: 14/705,270

(22) Filed: May 6, 2015

(65) Prior Publication Data

US 2016/0329369 A1    Nov. 10, 2016

(51) Int. Cl.
*H01L 27/14*     (2006.01)
*H01L 27/144*    (2006.01)
*H01L 31/00*     (2006.01)

(52) U.S. Cl.
CPC .......... *H01L 27/1446* (2013.01); *H01L 31/00* (2013.01)

(58) Field of Classification Search
CPC . H01L 27/14; H01L 27/146; H01L 27/14609; H01L 27/14636; H01L 27/14643; H01L 31/00
USPC .......................................................... 257/48
See application file for complete search history.

(56) References Cited

U.S. PATENT DOCUMENTS

| | | | |
|---|---|---|---|
| 4,403,397 A | 9/1983 | Bottka et al. | |
| 4,539,743 A | 9/1985 | Anthony et al. | |
| 5,204,520 A | 4/1993 | Green | |
| 5,223,704 A | 6/1993 | Hui et al. | |
| 5,329,112 A | 7/1994 | Mihara | |
| 5,349,174 A | 9/1994 | Van Berkel et al. | |
| 5,914,499 A | 6/1999 | Hermansson et al. | |
| 6,753,214 B1 | 6/2004 | Brinkmann et al. | |
| 7,943,406 B2 | 5/2011 | Slater, Jr. et al. | |
| 8,279,411 B2 | 10/2012 | Yuan et al. | |
| 9,029,772 B2 | 5/2015 | Pavlov | |
| 9,076,707 B2 | 7/2015 | Harmon | |
| 2004/0169991 A1 | 9/2004 | Nagata et al. | |
| 2004/0188793 A1 | 9/2004 | Lindemann et al. | |
| 2007/0085158 A1 | 4/2007 | Itzler et al. | |
| 2008/0164554 A1 | 7/2008 | Itzler et al. | |
| 2008/0220598 A1 | 9/2008 | Ben-Michael et al. | |

(Continued)

FOREIGN PATENT DOCUMENTS

WO    WO2011117309 A3    9/2011
WO    WO2014172697 A1    10/2014

OTHER PUBLICATIONS

U.S. ISA, "International Search Report—App. No. PCT/US15/29410", Sep. 29, 2015, WIPO.

(Continued)

*Primary Examiner* — Monica D Harrison
(74) *Attorney, Agent, or Firm* — Intrinsic Law Corp.

(57) ABSTRACT

A photodetector includes an array of pixels, each pixel comprising a defined doped region defined in a doped semiconductor layer. The defined doped region is defined by selected regions of ion implants to provide resistive isolation between each defined doped region. A capacitor is formed by the defined doped region and a metal layer disposed above the doped semiconductor layer. A contact metal line is disposed above the doped semiconductor layer. The capacitor metal and contact metal lines are electrically coupled together and are in electrical communication with the output of the photodetector array.

34 Claims, 19 Drawing Sheets

(56) References Cited

U.S. PATENT DOCUMENTS

| | | |
|---|---|---|
| 2010/0091162 A1 | 4/2010 | Chuang et al. |
| 2011/0272561 A1 | 11/2011 | Sanfilippo et al. |
| 2012/0009727 A1 | 1/2012 | Itzler |
| 2013/0099100 A1 | 4/2013 | Pavlov |
| 2013/0207217 A1 | 8/2013 | Itzler |
| 2013/0230339 A1* | 9/2013 | Ogihara .................... B41J 2/45 399/220 |
| 2014/0312448 A1 | 10/2014 | Harmon |
| 2015/0270430 A1 | 9/2015 | Harmon |

OTHER PUBLICATIONS

V. Saveliev et al., "Silicon avalanche photodiodes on the base of metal-resistor-semiconductor (MRS) Structures", Instruments & Methods in Physics Research, 2000, p. 223-229. Section A, No. 442, Elsevier Science B.V.

Z. Y. Sadygov et al., "Avalanche Semiconductor Radiation Detectors", 1996, p. 460-464.

F. Zappa et al., "Impact of Local-Negative-Feedback on the MRS Avalanche Photodiode Operation", IEEE on Electron Devices, Jan. 1998, p. 91-97, vol. 45, No. 1, IEEE.

A. Khodin et al., "Silicon Avalanche Photodiodes Array for Particle Detector: Modelling and Fabrication", Jun. 2000.

G. Collazuol, "The SiPM Physics and Technology—a Review", PhotoDet, Jun. 2012.

S. Seifert et al., "Similation of Silicon Photomultiplier Signals", IEEE Transactions on Nuclear Science, Dec. 2009, p. 3726-3733, vol. 56, No. 6, IEEE.

S. Tisa et al., "Electronics for single photon avalanche diode arrays", Sensors and Actuators, 2007, p. 113-122, vol. A, No. 140, Elsevier B.V.

A. G. Stewart et al., "Performance of 1-mm2 Silicon Photomultiplier", IEEE Journal of Quantum Electronics, Feb. 2008, p. 157-164, vol. 44, No. 2, IEEE.

A. Shuja, "Implant Isolation of Gallium Arsenide—Thesis presented to the Dept. of Electronic and Electrical Engineering, University of Surrey", May 2002, University of Surrey.

Y. Liu et al., "A Planar InP/InGaAs Avalanche Photodiode with Floating Guard Ring and Double Diffused Junction", Journal of Lightwave Technology, Feb. 1992, p. 182-193, vol. 10, No. 2, IEEE.

A. Henkel et al., "Boron Implantation into GaAs/Ga(0.5)In(0.5)P Heterostructures", Jpn. J. Appl. Phys., Jan. 1997, p. 175-180, vol. 36.

S. Daliento et al., "Helium implantation in silicon: detailed experimental analysis of resistivity and lifetime profiles function of the implantation dose and energy", Proceedings of the 18th International Symposium on Power Semiconductor Devices & ICs, Jun. 2006, IEEE.

H. E. M. Peres et al., "High Resistivity Silicon Layers Obtained by Hydrogen Ion Implantation", Brazilian Journal of Physics, Dec. 1997, p. 237-239, vol. 27/A.

C. Carmody et al., "Ultrafast trapping times in ion implanted InP", Journal of Applied Physics, Sep. 2002, p. 2420-23, vol. 92, No. 5, American Institute of Physics.

P. N. K. Deenapanray et al., "Implant isolation of Zn-doped GaAs epilayers: Effects of ion species, doping concentration, and implantation temperature", Journal of Applied Physics, Jun. 2003, p. 9123-29, vol. 93, No. 11, American Institute of Physics.

J. P. De Souza et al., "Electrical isolation in GaAs by light ion irradiation: The role of antisite defects", Appl. Phys. Lett, Jan. 1996, p. 535-537, vol. 68, No. 4, American Institute of Physics.

J. P. De Souza et al., "Thermal stability of the electrical isolation in n-type gallium arsenide layers irradiated with H. He, and B ions", J. Appl. Phys., Jan. 1997, p. 650-655, vol. 81, No. 2, American Institute of Physics.

A. R. Bratschun et al., "A Study of Implant Damage and Isolation Properties in an InGaP HBT Process", CS MANTECH Conference, May 2011.

P. Too et al., "Electrical isolation of n-type InP layers by helium implantation at variable substrate temperatures", Nuclear Instruments and Methods in Physics Research, 2002, p. 205-209, No. B188, Elsevier Science B.V.

C. Huang et al., "Implant Isolation of Silicon Two-Dimensional Electron Gases at 4.2 K", IEEE Electron Device Letters, Jan. 2013, p. 21-23, vol. 34, No. 1, IEEE.

P. Whiting, "Investigation of defects formed by ion implantation of H2+ into silicon", RIT Scholar Works Thesis/Dissertation Collection, 2009, Rochester Institute of Technology.

E. Wendler et al., "Empirical modeling of the cross section of damage formation in ion implanted III-V semiconductors", Appl. Phys. Lett., 2012, 100/192108, American Institute of Physics.

M. Mikulics et al., "GaAs photodetectors prepared by high-energy and high-dose nitrogen implantation", Applied Physics Letters, Sep. 2006, 89/091103, American Institute of Physics.

S. J. Pearton et al., "Ion implantation doping and isolation of In0.5Ga0.5P", Appl. Phys. Lett., Sep. 1991, p. 1467-69, vol. 59, No. 12, American Institute of Physics.

S. Ahmed et al., "Electrical isolation of n-type GaAs devices by MeV/MeV-like implantation of various ion species", 2002, p. 18-23, IEEE.

S. Ahmed et al., "Implant isolation in GaAs device technology: Effect of substrate temperature", Nuclear Instruments and Methods in Physics Research, 2002, p. 196-200, B188, Elsevier Science B.V.

* cited by examiner

INTEGRATED AVALANCHE PHOTODIODE ARRAYS

GOVERNMENT SUPPORT

Aspects of the present benefited from US Government support under SBIR Phase II, Grant No. 2R44DA028813-02A1 awarded by the National Institutes of Health. The US Government may have certain rights in the invention(s) pursuant to 35 USC Section 202(c)(6), as applicable.

TECHNICAL FIELD

The present application is directed to integrated photon detectors or photodetector devices incorporating implant isolation mesas and resistors, and in particular, to methods and structures for improving the output signal strength of such devices.

BACKGROUND

Avalanche Photodiodes (APDs) are photodetectors that use avalanche multiplication to achieve internal gain. Many prior art sources describe photodetectors, such as J. C. Campbell, "Recent Advances in Telecommunications Avalanche Photodiodes," J. Lightwave Technology v. 25(1) Pp. 109-121 (2007), which are hereby incorporated by reference. Single photon avalanche photodiodes (SPADs) are a specific class of avalanche photodiodes that are capable of detecting single photons. Examples of SPADs are given for example in S. Cova, et al., "Evolution and prospects for single-photon avalanche diodes and quenching circuits," J. Modern Optics v. 51(9-10) Pp. 1267-1288 (2004), which is hereby incorporated by reference.

APD and SPAD arrays are also known in the art, and include a range of devices such as the silicon photomultiplier (SiPM), the multi-pixel photon detector (MPPC), and a number of similar devices. Reference is made to the digital SiPM (dSiPM) approach disclosed in US Pub. Nos. 2011/0079727, 2010/0127314, and T. Frach et al. "The Digital Silicon Photomultiplier—System Architecutre and Performance Evaluation," 2010 IEEE Nuclear Science Symposium Conference Record (NSS/MIC), Pp. 1722-1727 (2010), which are hereby incorporated by reference. Other examples of prior devices are described in International Workshop on New Photon-detectors 2012, LAL Orsay, France, and the presentation entitled "The SiPM Physics and Technology—a Review—," G. Collazuol, found online at the time of this submission at http://indico.cern.ch/getFile.py/access?contribId=72&resId=0&materialId=slides&confId=164917; W-S Sul et al. "Guard Ring Structures for Silicon Photomultipliers," IEEE Electron; Dev., Lett, v.31 (1) Pp 41-43 (2010); A. G. Stewart et al. "Performance of 1-mm2 Silicon Photomultiplier," IEEE J. Quantum Electronics Vol. 44(2) pp. 157-164, (2008), all of which are hereby incorporated by reference. A simple SPAD array devices incorporates a single photon avalanche diode (SPAD) and a passive quench circuit. The passive quench circuit consists of a current limiting element (usually a resistor) in parallel with a bypass capacitor as described in S. Tiza et al. "Electronics for single photon avalanche diode arrays," Sensors and Actuators A 140, Pp. 113-122 (2007) and S. Seifert et al. "Simulation of Silicon Photomultiplier Signals," IEEE Trans. Nuclear Science, v. 56(6) Pp. 3726-3733 (December 2009). All of the above references are incorporated herein by references.

Prior art APD arrays have also used various techniques for isolating adjacent APD elements. For example PN junction isolation and mesa isolation are well known in the prior art. PN junction isolation is generally achieved by confining the lateral extent of doping to separate p-type regions (on an n-type substrate) or n-type regions (on a p-type substrate) or both. Edge effects in isolated devices often results in electrical field crowding along the perimeter of the APD device, which would normally cause a non-uniform avalanche gain profile. Edge effects in isolated devices are mitigated through the use of double-diffused structures, guard ring structures, or other approaches well known in the state of the art (see, for example, Y. Liu, S. R. Forrest, J. Hladky, M. J. Lange, G. H. Olsen, and D. E. Ackley, "A Planar InP/InGaAs Avalanche Photodiode with Floating Guard Ring and Double Diffused Junction," J. Lightwave Technology, v. 10(2) February 2991, and Chapter 3: Breakdown Voltage in Power Semiconductor Devices, Pp. 67-127 by B. J. Baliga, PWS Publishing Company, Boston, Mass. 1996).

Mesa isolation can be used to define the active area of a APD and to laterally isolate adjacent APD elements, by partially or fully removing the conductive pathway between adjacent APD elements. The use of a beveled edge structure in mesa isolation can be used to mitigate edge effects, but places stringent demands on the mesa structure (bevel angle) and surface state density of the mesa. Beveled edge mesa structures are described in detail by B. J. Baliga "Power Semiconductor Devices," Pp. 103-111, PWS Publishing Company, Boston, Mass., which is hereby incorporated by reference.

Ion implantation isolation is used to render a semiconductor region insulating, semi-insulating, or very low conductivity. Ion implantation isolation is often used with respect to compound semiconductor devices where ion implantation creates a sufficient amount of deep levels in a semiconductor region to compensate some of the doping in said semiconductor region, thereby reducing conductivity and often rendering the region highly resistive. For all cases of ion implantation isolation, a residual conductivity remains, with experimental values often exceeding 1E9 ohms/square, though lower values of resistivity are also common. The residual conductivity is often attributed to residual free carrier conductivity and/or hopping conduction. For semiconductors such as Si, SiGe, SiC, GaAs, AlGaAs, GaInP, InGaAsP, InGaAlAs, and InAlInN, implant isolation is often achieved by using hydrogen ions, helium ions, oxygen ions, nitrogen ions, boron ions, fluorine ions, arsenic ions, and phosphorous ions, through those skilled in the art will recognize that any suitable ion may be used. The residual conductivity is a function of the implant species, implant energy, implant dose, implant profile, and semiconductor material. While conventional ion implantation for doping generally achieves (at most) 1 free carrier for each dopant atom, ion implantation isolation often achieves a multiplier effect whereby implantation of a single atom (or species) can produce a 10-fold or higher reduction in the free carrier concentration. This occurs because the lattice damage induced by the implanted ion produces the compensating donors/acceptors, and not the specific ion itself. In some cases, the specific ion may also be used as a compensating level, such as through the use of arsenic implantation in GaAs. Ion implant isolation is well known in the literature, as illustrated by one or more of the following references: Q. Zhou, et al. "Proton-Implantation-Isolated 4H—SiC Avalanche Photodiodes," IEEE Photonics Technology Lett. v. 21(23) Pp. 1734-1736 (2009); I. Sandall, et al. "Planar InAs photodiodes fabricated using He ion implantation," Optics Express v.20(8) Pp. 8575-8583 (2012); Q. Zhou, et al. "Proton-Implantation-Isolated Separate Absorption Charge and Multiplication 4H—SiC Avalanche Photodiodes," IEEE Photonics Technology Letters v. 23(5) Pp. 299-301 (2011); G. E. Bulman, et al. "Proton isolated In0.2Ga0.8As/GaAs strained layer superlattice avalanche photodiode," Appl. Phys. Lett. v.48, Pp. 1015-1017 (1986); I. Danilov, et al. "Electrical isolation of InGaP by proton and helium ion irradiation," J. Appl. Phys., v. 92 Pp. 4261-4265 (2002); S. J. Pearton, "Ion Implantation for Isolation of III-V Semiconductors," Materials science reports, v. 4(8), (1990); Vasteras Willy Hermansson, et al. in U.S. Pat. No. 5,914,499, entitled "High Voltage Silicon Carbide Semiconductor device with bended edge" (1999); Tzu-Yu Wang, U.S. Pub. No. 2005/0078725, entitled "Methods for Angled Ion Implantation of Semiconductor Devices, (2005); D. B. Slater, et al., U.S. Pat. No. 7,943,406 "LED Fabrication via ion implant isolation" (2011); and C-T Huang, J-Y Li, and J. C. Sturm, "Implant Isolation of Silicon Two-Dimensional Electron Gases at 4.2K," IEEE Electron Dev. Lett., v. 34(1), Pp 21-23 (2013).

A physical beveled edge mesa structure can be fabricated on a photodetector as illustrated in FIG. 1. Semiconductor layers 101 and 102 are formed on a semiconductor substrate 100 using techniques known in the art. Layer 101 is an n-type semiconductor layer with a thickness 111. Layer 102 is a p-type semiconductor layer with a thickness 112. The doping density of n-type semiconductor layer 101 is higher than the doping density of p-type semiconductor layer 102, such that the thickness or width 133 of the depletion region on the p-type side of the junction is larger than the thickness or width 134 of the depletion region on the n-type side of the junction. The dashed line 122 represents the edge of the depletion region in the p-type side of the device, while dashed line 121 represents the edge of the depletion region on the n-type side of the device.

With the appropriate choices for the doping densities in layers 101 and 102, and the bevel angle 131, the total depletion layer thickness 132 in the center portion of the device can be made smaller than the total depletion layer thickness 135 at the perimeter of the device, with the net result that the electric field in the center of the device is larger than the electric field along the perimeter of the device, which therefore allows the device performance to be dominated by the bulk properties of the semiconductor in the center of the device, and reduces the dependence of the device performance on the perimeter.

FIG. 2 illustrates a virtual beveled edge mesa sidewall 205, as described in U.S. application Ser. No. 14/257,179, which is assigned to the same assignee as the present application, and is incorporated herein by reference. The geometries and dimensions of the implant isolated semiconductor regions 201B and 202B are chosen to achieve a positive bevel angle 231 between the implanted regions 201B and 202B and the non-implanted regions 201A and 202A as shown in FIG. 2. In this embodiment, the implant isolated semiconductor region is used to entirely confine the lateral extent of the p-type semiconductor region 202A and the n-type semiconductor regions 201A of the virtual beveled edge APD structure. In the shown embodiment, an n-type semiconductor region 201 and a p-type semiconductor region 202 are grown on top of an n-type semiconductor substrate 200. Implant isolation through a beveled mask is used to define the lateral geometry of the implant. Regions 201B and 202B are the implanted volume of layers 201 and 202 respectively, with the isolation implant chosen to compensate the doping of regions 201B and 202B by at least an order of magnitude in some embodiments, and consequently increase the resistivity of regions 201B and 202B in some embodiments by at least an order of magnitude compared to the unimplanted regions 201A and 202A. The thickness of layer 201 is 211 and the thickness of layer 202 is 212. The thickness of the depletion region in the center of the n-type region 201A is 234, while the thickness of the depletion region in the center of n-type region 202A is 233, and the total depletion region thickness in the center of the device is 232, while the thickness of the depletion region along the virtual beveled mesa edge 205 is 235.

Advantages of the virtual beveled edge mesa structure include performance and ease of fabrication. For example, the virtual mesa does not require a physical extension of the mesa above the layers of the device as was required in the prior art of FIG. 1.

FIG. 3 illustrates a side view of a photodetector pixel array 30 represented by pixels 462A and 462B. The array 30 is formed of a n-type semiconductor region 400, a non-intentionally doped region 401, a p-type semiconductor layer 402, a graded doped p-type layer 403, and a heavily doped p-type contacting layer 404. The heavily-doped layer 404 is patterned into regions 404A, which are disposed above each unimplanted region 402A, as described below. The combination of layers 402, 401, and 400 form a PIN diode structure. The pixels 462A, 462B each include a virtual beveled edge structure defined by implanted regions 402B, 403B and unimplanted regions 402A, 403A. A guard contact 461 surrounds the perimeter of the entire array, and provides a means of isolating the pixels of the array from anything in the exterior of the guard ring. A separate anode connection to each device is 402A, and a common cathode contact 450 is disposed below the n-type semiconductor layer 400. Those skilled in the art will recognize that a similar NIP diode can be formed, with separate cathode connections and common anode connections (see US Patent Application Publication No. 2004/0245592 entitled solid state microchannel plate photodetector by Harmon et al., which is herein incorporated by reference).

The connection between each pixel 462A, 462B and the cathode contact 450 can be represented as a SPAD capacitance ($C_{SPAD}$) 435 and the shunt resistance of the SPAD ($R_{SPAD}$) 436 disposed in parallel with each other. In general, the SPAD elements are small (e.g., between 1 μm×1 μm to 100 μm×100 μm), and the resulting SPAD capacitance ($C_{SPAD}$) 435 ranges from about 0.1 fF to 10 pF. Shunt resistance ($R_{SPAD}$) 436 is typically greater than 10 GOhm, though it depends on the specific semiconductor materials and processing procedures used to form the SPAD element.

FIG. 4 is a circuit diagram of the anode connections to a prior art photodetector pixel array 30', which can be the photodetector array 30 described above. As illustrated, the anode of each pixel 40 is electrically coupled to output 45 through a parallel RC circuit 41 comprising an optional capacitor 42 and a resistor 43. The optional capacitor 42 represents a capacitor formed using any method, including using a metal-insulator-metal structure with two metal plates separated by an insulator. A parasitic capacitance (Cp) 47 is also formed between pixel 40 and output 45. The resistor 43 represents a discrete resistor connected between pixel 40 and output 45, and is usually achieved through deposition of a highly resistive thin film, such as polysilicon, very thin metal, or thin silicides. A high frequency signal generated by an incident photon passes through the optional capacitor 42 and/or parasitic capacitance 47 (bypassing the resistor 43), thus allowing for high speed output signals.

At the edge of the array is the ring contact 461, which connects the output of each SPAD element 40 to the output 45. The purpose of the ring contact 461 is to provide analog summation of the currents from each SPAD 40 and connection to the output 45, which generally includes a load resistor 46.

One difficulty with the prior art shown in FIG. 4 is the necessity of incorporating a discrete resistor 43 (and optional capacitor 42) for each pixel 40, as well as the need to provide direct electrical connection between resistor 43 and output 45. This necessitates various processing steps (e.g., metal deposition, patterning, dielectric deposition, etc.) to provide ohmic contact to pixel 40, connection between the ohmic contact and resistor 43 (and optional capacitor 42), and connection between each resistor 43 (and optional capacitor 42) and output 45 using interconnect metal lines between each resistor 43 and the output 45. Each contact, resistor, capacitor and connection consumes significant semiconductor real estate and therefore reduces the available semiconductor area for each pixel 40, reducing the optical sensitivity of each pixel 40.

A challenge remains to fabricate effective avalanche photodetector devices, which have favorable performance and scalability yet have favorable signal detectability. This disclosure addresses and remedies these and other failings of the prior art physical mesa photodetectors and similar devices.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a photodetector array. The photodetector array includes a substrate layer and a plurality of doped semiconductor layers including a first semiconductor layer doped with a first dopant disposed above the substrate and a second semiconductor layer doped with a second dopant disposed above the first semiconductor layer and proximal thereto. At least the second semiconductor layer is ion implanted in a plurality of selected regions thereof. The ion implants form defined doped regions between adjacent selected regions. The photodetector array also includes a metal layer disposed above said second semiconductor layer and in electrical communication with an output of the array, providing an advantageous means of coupling the SPAD signal to the output.

In some embodiments, the selected regions are implanted at positive lateral profile angles with respect to a normal to said second semiconductor layer so as to form a corresponding plurality of mesa structures having angled side profiles, each said mesa structure tapering to a narrowed cross-sectional width, the narrowed cross-sectional width in a direction orthogonal to said normal. In some embodiments, the selected regions can have substantially vertical sidewalls. In some embodiments, the selected regions are implanted at negative lateral profile angles with respect to a normal to said second semiconductor layer so as to form a corresponding plurality of inverse mesa structures having angled side profiles, each inverse mesa structure expanding to a widened cross-sectional width, the widened cross-sectional width in a direction orthogonal to said normal.

The metal layer can be an elongated metal line having a metal width less than a cross-sectional width of the selected region, whereby each mesa structure and metal layer forms a capacitor. A dielectric layer can be disposed between the second semiconductor layer and said metal layer. The elongated metal layer can be disposed above a center of said narrowed cross-sectional width of said mesa structure. In some embodiments, the metal layer is an elongated metal line having a metal width less than a cross-sectional width of said narrowed cross-sectional width, whereby each mesa structure and metal layer forms a capacitor.

A contact metal line can be disposed along a perimeter of said array, the contact metal line in electrical communication with the output and the metal layer. In some embodiments, the metal layer, the dielectric layer, and selected region form a first capacitor. The first capacitor can have a first capacitance of between 10% and 1000% of the capacitance of a SPAD capacitor, the SPAD capacitor formed by the selected region and the second semiconductor layer. In some embodiments, the first capacitor is directly connected to the output.

Another aspect of the invention is directed to a photodetector. The photodetector includes an array of pixels. Each pixel comprises a first doped semiconductor layer comprising a first region and a second region of ion implants that form a defined doped region there between. The photodetector also includes a capacitor comprising the defined doped region and a capacitor metal disposed above the first doped semiconductor layer. The photodetector also includes a contact metal line electrically coupled to the capacitor and an output of the array.

In some embodiments, the defined doped region is a virtual mesa. In some embodiments, the first and second regions are implanted at positive lateral profile angles with respect to a normal to the first doped semiconductor layer so as to form a corresponding plurality of mesa structures having angled side profiles, each mesa structure tapering to a narrowed cross-sectional width, the narrowed cross-sectional width in a direction orthogonal to the normal. In some embodiments, the defined doped region has substantially vertical sidewalls. In some embodiments, the first and second regions are implanted at negative lateral profile angles with respect to a normal to the first doped semiconductor layer so as to form a corresponding plurality of inverse mesa structures having angled side profiles, each inverse mesa structure expanding to a widened cross-sectional width, the widened cross-sectional width in a direction orthogonal to the normal.

The capacitor metal can comprise a metal line. A width of said metal line can be less than a cross-sectional width of the defined doped region, the width of the capacitor metal line in a direction orthogonal to a normal to the metal line. In some embodiments, the capacitor metal is disposed above said defined doped region. The capacitor metal can include a transparent conductor layer, the transparent conductor layer disposed above the virtual mesa and the first and second ion implanted regions. In some embodiments, the transparent conductor layer comprises at least one of indium doped tin oxide, graphene, carbon nanotubes, and conductive polymers.

A dielectric layer can be disposed between the first doped semiconductor layer and the capacitor metal. In some embodiments, a contact metal line is electrically coupled to the capacitor metal. In some embodiments, the contact metal line is electrically coupled to the capacitor metal by a metal contact disposed in a VIA that extends from the contact metal line to the capacitor metal. In some embodiments, the at least one of said first and second ion implanted regions is disposed between the defined doped region and an adjacent defined doped region.

In some embodiments, a non-intentionally doped semiconductor layer is disposed below the first doped semiconductor layer. In some embodiments, a second doped semiconductor layer is disposed below the non-intentionally doped semiconductor layer, the second doped semiconductor layer having a second charge carrier, the second charge carrier having an opposite polarity to a first charge carrier of the first doped semiconductor layer, wherein the first doped semiconductor layer, the non-intentionally doped semiconductor layer, the said second doped semiconductor layer comprises a PIN diode or a NIP diode.

In some embodiments, a patterned semiconductor layer is disposed between the contact metal and the first or second region of ion implants, the patterned semiconductor layer comprising a third charge carrier having a same polarity as a first charge carrier of the first doped semiconductor layer. The first capacitor can have a first capacitance of between 10% and 1000% of a SPAD capacitance of a SPAD capacitor, the SPAD capacitor formed by the defined doped region and a common cathode contact disposed below the first doped semiconductor layer.

In some embodiments, the capacitor metal comprises a row readout capacitor and a column readout capacitor for each pixel, wherein the row readout capacitor is electrically isolated from the column readout capacitor. The row readout capacitor can be disposed orthogonally to the column readout capacitor. Each of said row readout capacitors in a row of the array can be electrically connected to a row readout line, which can provide connection to a row readout circuit. Each of the column readout capacitors in a column of the array can be electrically connected to a column readout line, which can provide connection to a column readout circuit, wherein an active pixel in the array can be determined by monitoring the row and column readout circuits for coincident signal pulses. In some embodiments, the row readout metal line and/or the column readout metal line is electrically connected to the first capacitor.

In some embodiments, the contact metal line is disposed above the first or second region of ion implants.

IN THE DRAWINGS

For a fuller understanding of the nature and advantages of the present concepts, reference is made to the following detailed description of preferred embodiments and in connection with the accompanying drawings, in which.

DETAILED DESCRIPTION

As discussed above, the present inventions provide a number of improvements and new devices and methods for making and using the same, including for single photon avalanche detector devices.

Figure 1:
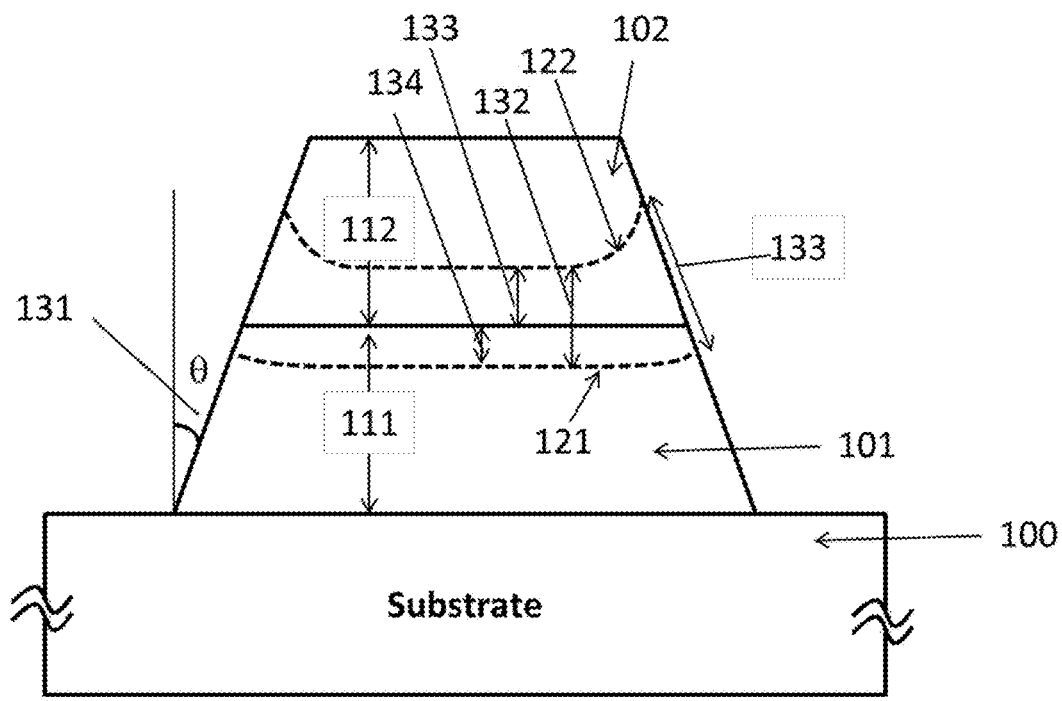
FIG. 1 illustrates a physical mesa structure that can be used in a prior art photodetector device.
Figure 2:
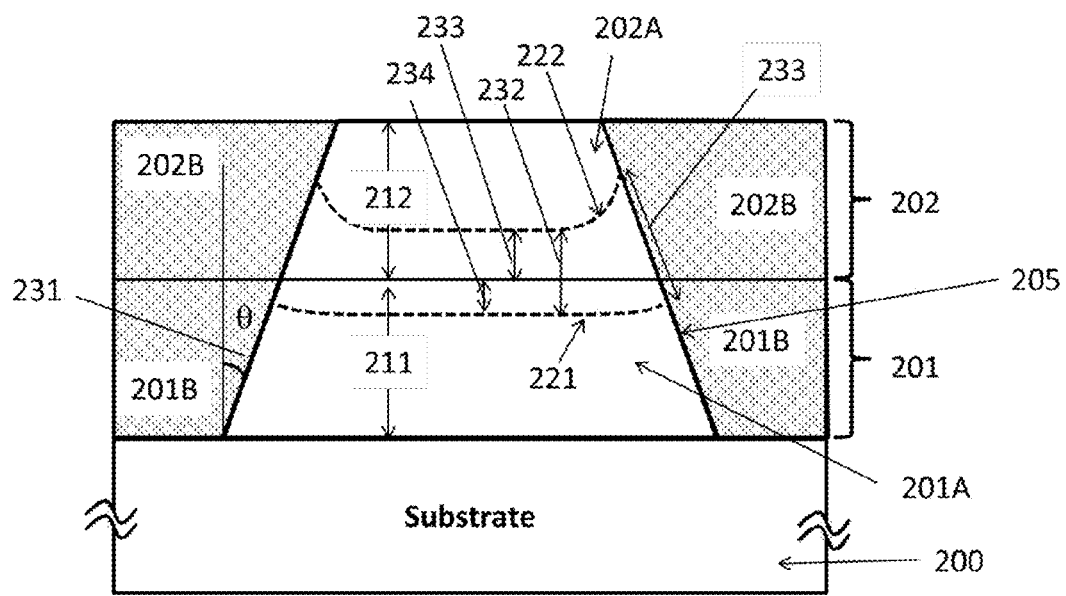
FIG. 2 illustrates an embodiment of a virtual positive beveled edge mesa structure that can be used in a prior art photodetector device.
Figure 3:
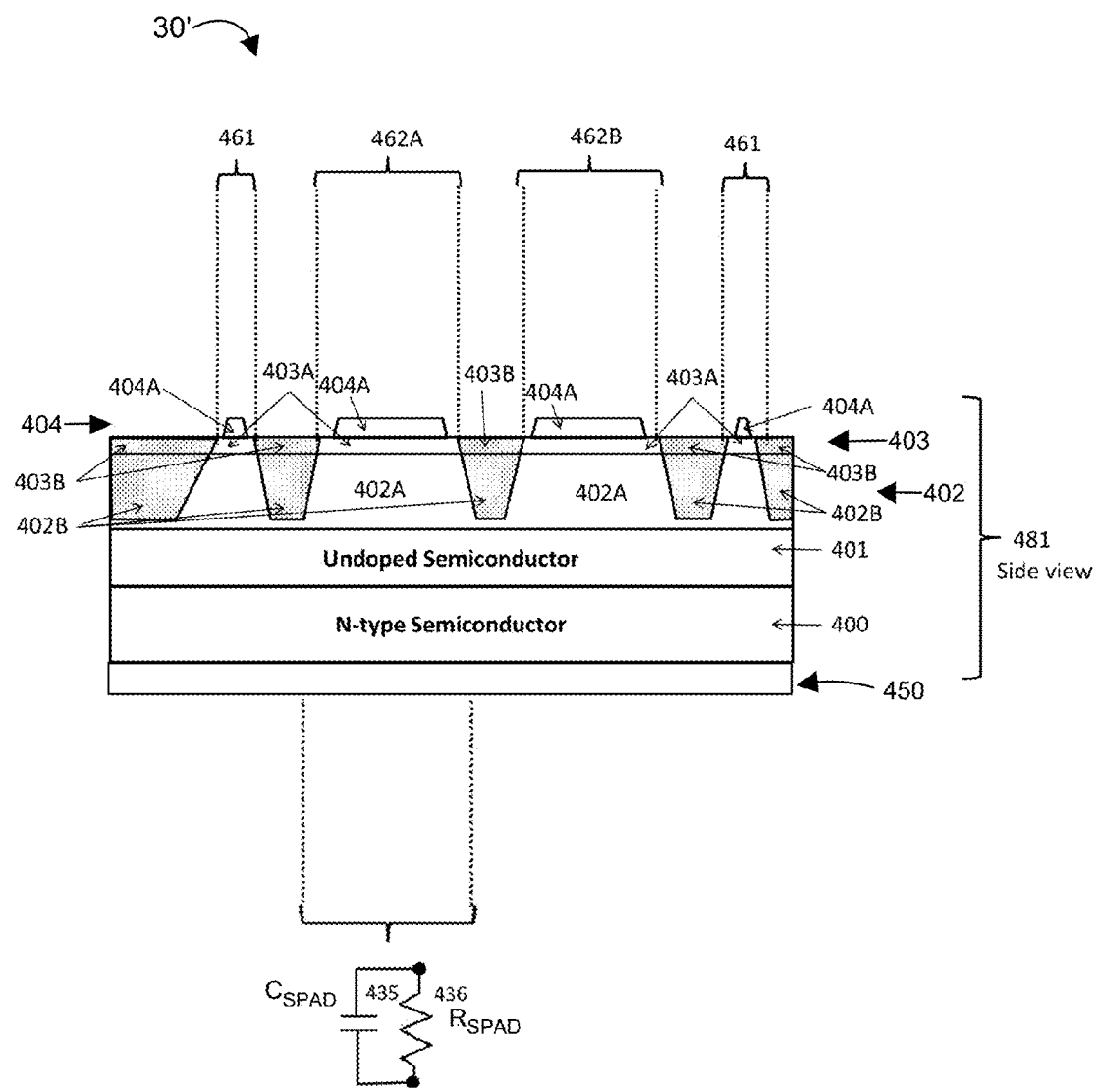
FIG. 3 illustrates a side view of a photodetector pixel array that can be used in a prior art photodetector device.
Figure 4:
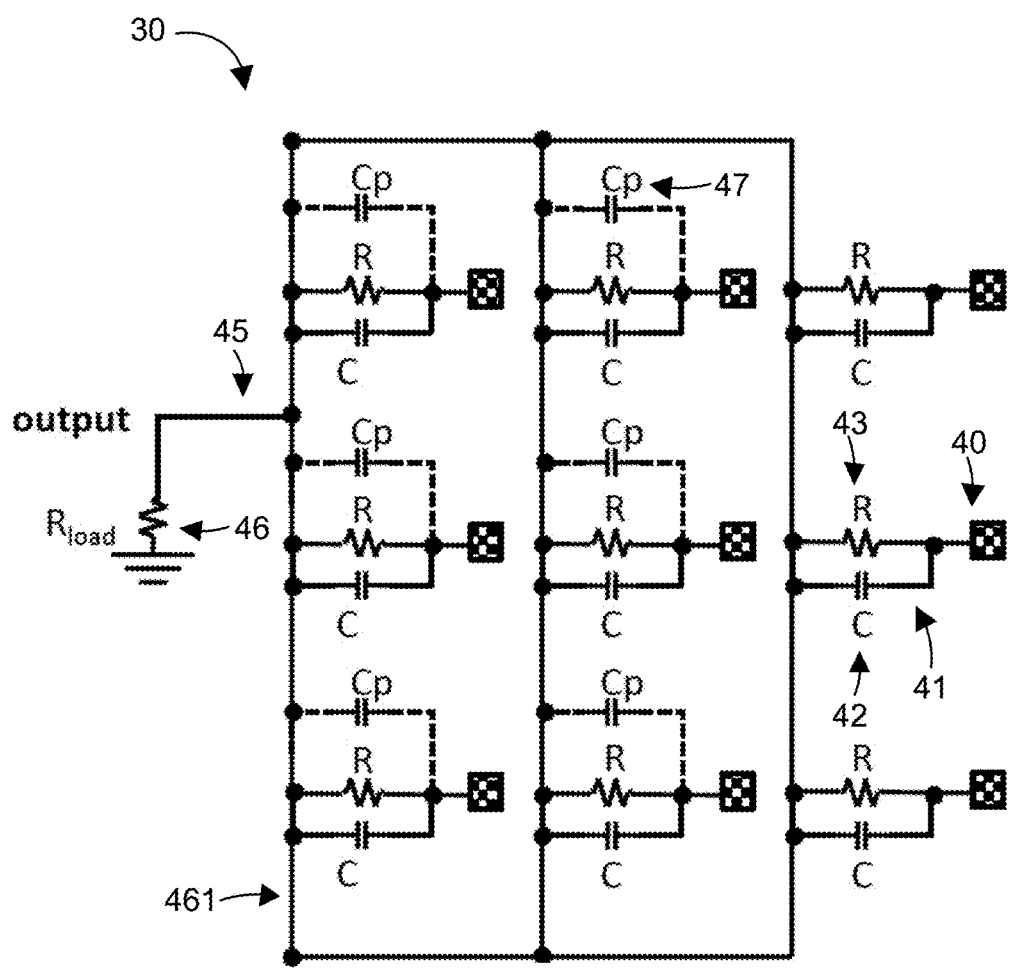
FIG. 4 is a circuit diagram of the photodetector pixel array from FIG. 3.
Figure 5:
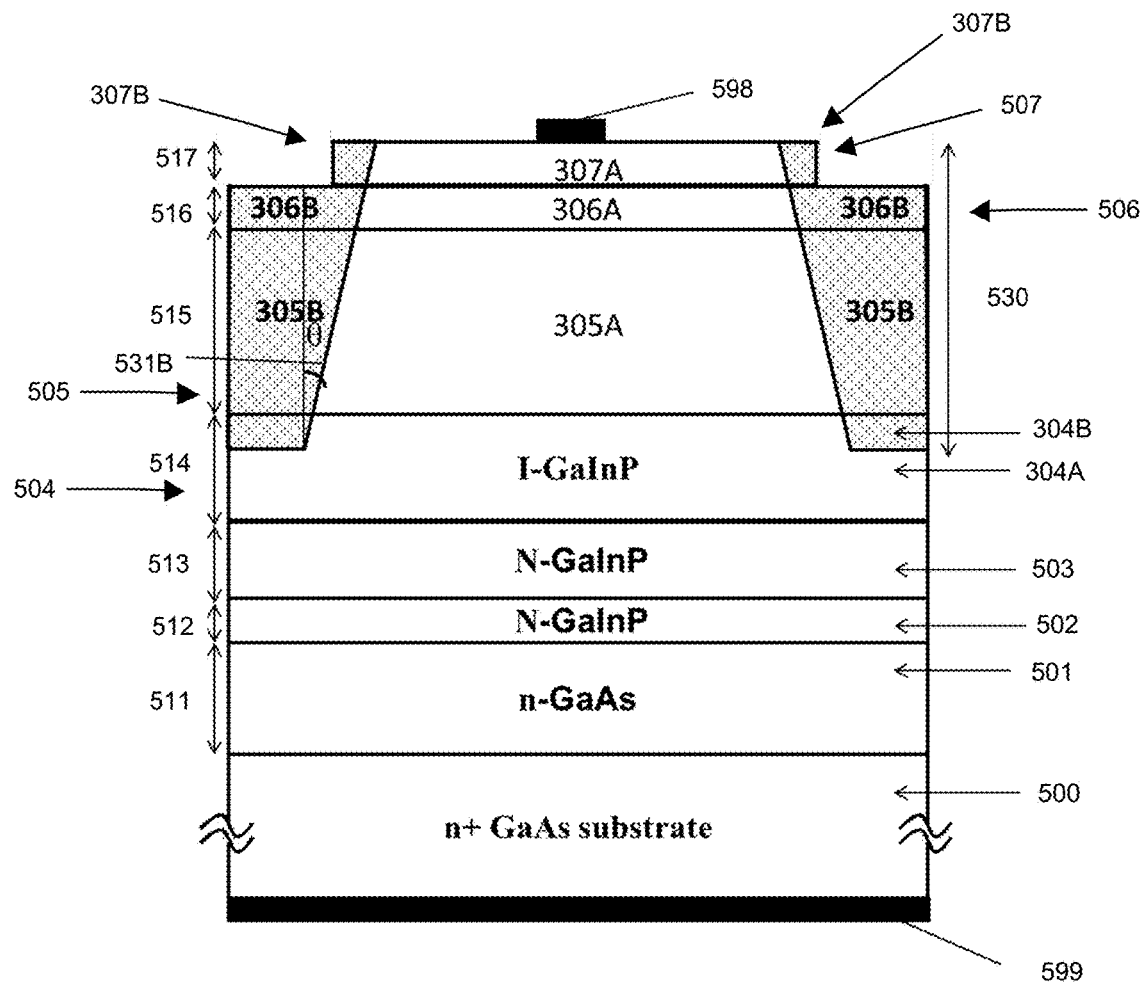
FIG. 5 illustrates an embodiment of a photodetector device having a virtual beveled edge mesa.

FIG. 5 illustrates an embodiment of a photodetector device having a virtual beveled edge mesa structure as described above. As illustrated, a plurality of layers 501-507 are disposed on a n+ GaAs substrate 500. Layers 501-507 can be deposited using conventional semiconductor manufacturing techniques such as chemical vapor deposition (e.g., metal-organic chemical vapor deposition). Those skilled in the art will recognize that any suitable ways of achieving the layered structure shown can be used. Layer 501 of thickness 511 is a n-type GaAs buffer layer grown directly on top of substrate 500, and is used to initiate high-quality epitaxial growth. Layer 501 comprises a GaAs layer doped n-type to a doping density of $5 \times 10E17$ cm$^3$ and grown to a thickness 511 of 500 nm. Layer 502 comprises a Ga0.51In0.49P layer doped n-type to a doping density of $5 \times 10E18$ cm$^3$ and grown to a thickness 512 of 50 nm. Layer 503 comprises a Ga0.51In0.49P layer doped n-type to a doping density of $1 \times 10E18$ cm$^3$ and grown to a thickness 513 of 100 nm. Layer 504 comprises a not deliberately doped Ga0.51In0.49P layer grown to a thickness 514 of 250 nm, meaning generally that the layer may include some dopant. Layer 505 comprises a Ga0.51In0.49P layer doped p-type to a doping density of $1 \times 10E17$ cm$^3$ and grown to a thickness 515 of 950 nm. Layer 506 comprises a Ga0.51In0.49P layer doped p-type to a doping density of $5 \times 10E18$ cm$^3$ and grown to a thickness 516 of 50 nm. Layer 507 comprises a GaAs contacting layer doped p-type to a doping density of $5 \times 10E19$ cm$^3$ and grown to a thickness 517 of 120 nm. The thickness 517 of layer 507 is chosen, in part, to both enable good ohmic contacts to be achieved as well as to provide a sacrificial layer for the isolation implant, which enables a He+ implant with an energy of 15 keV to be used with the peak of the ion implantation damage occurring in layer 306, which can have a factor of 50-fold higher doping than layer 305, so requires approximately 50-fold higher damage.

It bears repeating that the dimensions, materials, concentrations and other specific examples provided herein are merely illustrative, and those skilled in the art would appreciate other particular implementations suited for one purpose or another upon review of the present disclosure. As such, none of the parameters and quantitative values given herein are meant to be limiting. This includes the ordering and polarity of the constituent layers of a given embodiment, which can also be modified as needed to suit a particular application.

Regions 304B, 305B, 306B, and 307B are portions of layers 504, 505, 506 and 507, respectively, that are isolation ion implanted with He+ ions to form a virtual beveled mesa structure with a bevel angle of 531B. The He+ ions can be implanted using the energies and doses in Table 1. The He+ ion implantation is performed while regions 304A, 305A, 306A, and 307A are masked and, thus, protected from the isolation implant.

TABLE I

| He$^+$ ion energy | Dose |
|---|---|
| 15 keV | 2.5E13/cm$^2$ |
| 25 keV | 0.8E11/cm$^2$ |
| 70 keV | 4.4E11/cm$^2$ |
| 120 keV | 3.2E11/cm$^2$ |
| 195 keV | 1.0E11/cm$^2$ |

Those skilled in the art might appreciate that while the implant energies chosen may not fully penetrate through layer 504, efficient isolation of the p-type layers (layers 505, 506, and 507) can be achieved, because the PN junction causes the relevant regions of layer 504 to be fully depleted. Those skilled in the art might also appreciate that different implantation energies and doses may be utilized as long as the resulting beveled edge mesa structure is achieved and as long as the implanted regions exhibit at least an order of magnitude lower free carrier concentration than the unimplanted regions. Upon completion of the implant, the entire structure is annealed to partially heal the implant damage and to stabilize the structure. Layer 507 is optionally patterned and etched to selective remove a portion of layer 507 above regions 306B.

Metal contact 598 forms an anode contact to p+ GaAs layer 307A, and metal contact 599 forms the cathode contact to the n-GaAs substrate 500.

Figure 6:
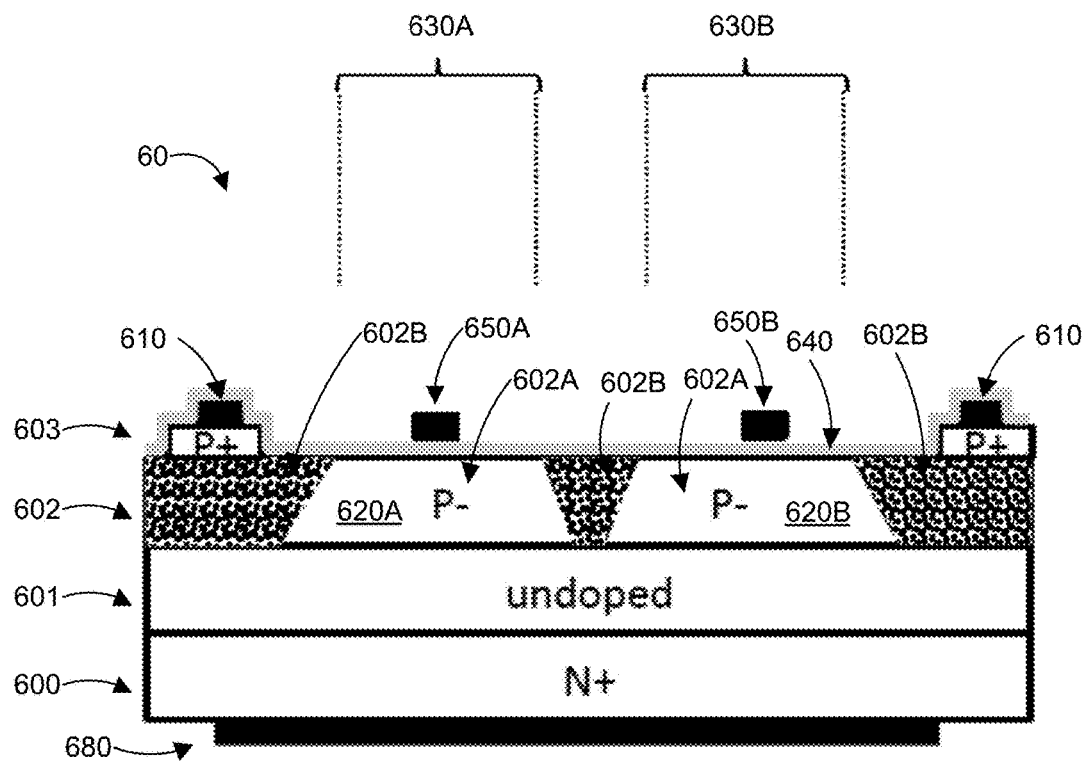
FIG. 6 illustrates a cross section of an SPAD array structure according to an embodiment.

FIG. 6 illustrates a cross section of an SPAD array structure 60 according to an embodiment. In cross section, the device layer structure is simplified, showing only a heavily-doped n-type semiconductor layer 600, a non-intentionally doped layer 601, a lightly-doped p-type semiconductor layer 602, and a patterned heavily doped p-type semiconductor portion 603. The combination of layers 602, 601, and 600 form a PIN diode structure for the SPAD pixels. The heavily-doped p-type portion 603 is added to provide connection to contact metal 610 and to facilitate contacts, as discussed below. The p-type portion 603 is patterned to prevent shorting to virtual mesas 620A/B, forcing current flow through implanted region 602B, and thereby achieving the desired resistance 810 (labeled R) and resistance 810' (labeled R') in FIG. 8. Of course, the structure could be inverted, forming a NIP diode structure, and that APD device design does not require the use of an undoped region 601, so the invention is also suitable with PN and NP layer designs.

Layer 602 includes regions 602B that are isolation implanted with He+ ions as discussed above. The implanted regions 602B define virtual mesa structures 620A, 620B in the unimplanted regions 602A. It is noted that the depth of implanted regions 602B can extend into the non-intentionally doped layer 601 and/or the heavily-doped n-type semiconductor layer 600. The ion species, energy, and dose of the isolation implant are selected to render the net doping concentration the implanted regions 602B at least an order of magnitude less than the net doping concentration in regions 620A and 620B, and to provide the desired resistance between virtual mesas 620A and 620B, as well as to provide the desired resistance between virtual mesa 620A and contact 610, and similarly the desired resistance between virtual mesa 620B and contact 610. This resistance is used to provide the resistor 810 (labeled R) and resistor 810' (labeled R') in FIG. 8, with values typically ranging from 10 kOhm to 10 MOhm.

By forming the resistor 810 from regions 602B, which define and isolate the virtual mesas 602A, 602B, significant semiconductor real estate can be conserved thus allowing for a higher density array of photodetector pixels. This is an advantage over the approach of depositing a discrete resistor (e.g., according to the prior art).

The virtual mesas 620A, 620B can be defined and arranged in an array having various configurations. Each virtual mesa 620A, 620B in combination with the PIN diode forms a corresponding pixel 630A, 630B.

The heavily-doped p-type layer 603 is thin (e.g., 10-500 nm or any thickness therebetween including 50 nm, 100 nm, 150 nm, 200 nm, 250 nm, 300 nm, 350 nm, 400 nm, and 450 nm) and can be formed from a material that can be selectively etched from the underlying p– layer 602. For example, layer 603 can be p+ GaAs and layer 602 can be p-GaInP. Alternatively, an etch stop layer can be disposed between the p+ layer and the P– layer. Additionally, some designs will incorporate a window layer to reduce surface recombination as is well known for solar cell design. In certain designs, this window layer can be used as a etch stop layer for the p+ layer.

Figure 7:
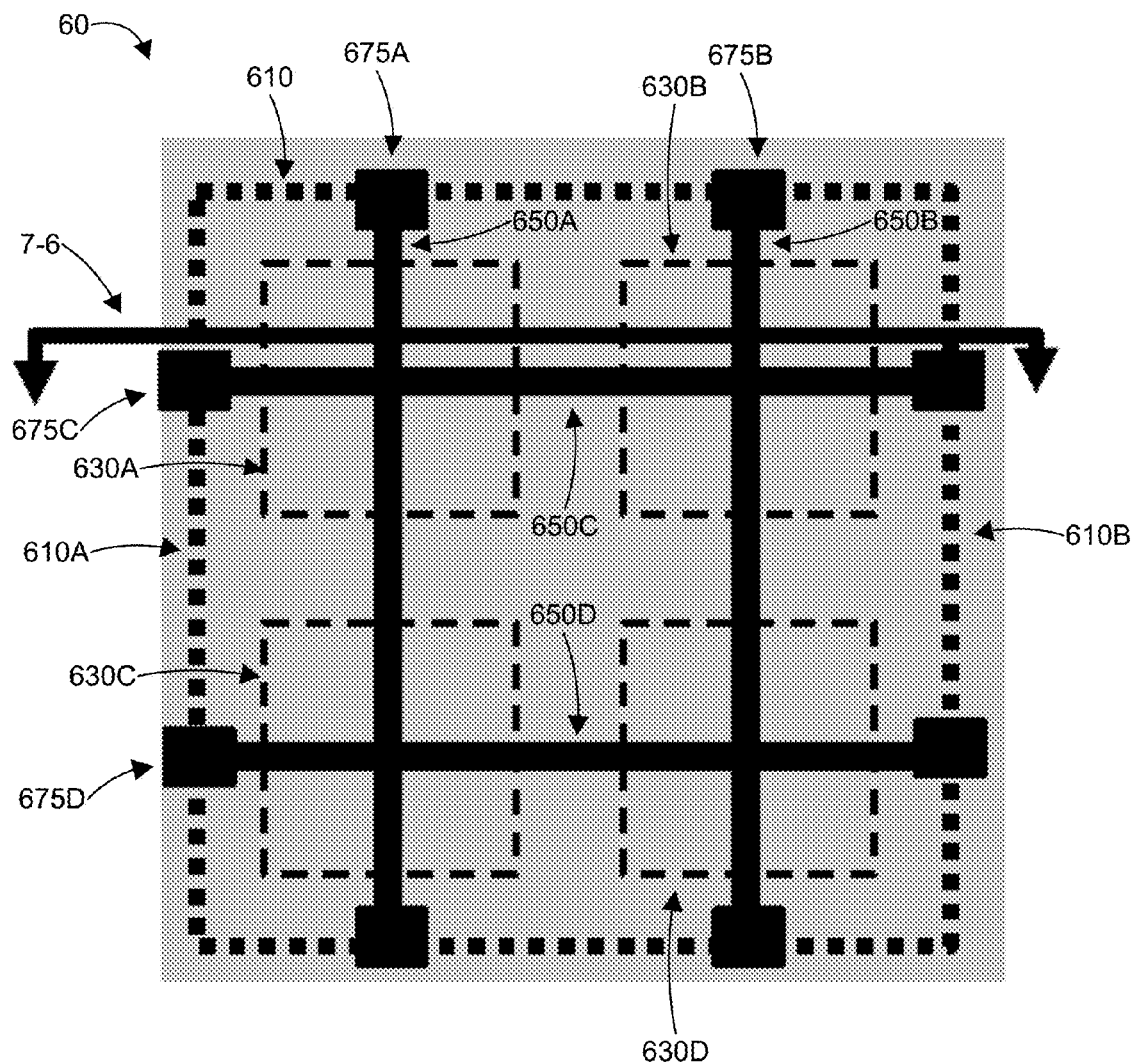
FIG. 7 illustrates a top view of the SPAD array structure illustrated in FIG. 6.
Figure 8:
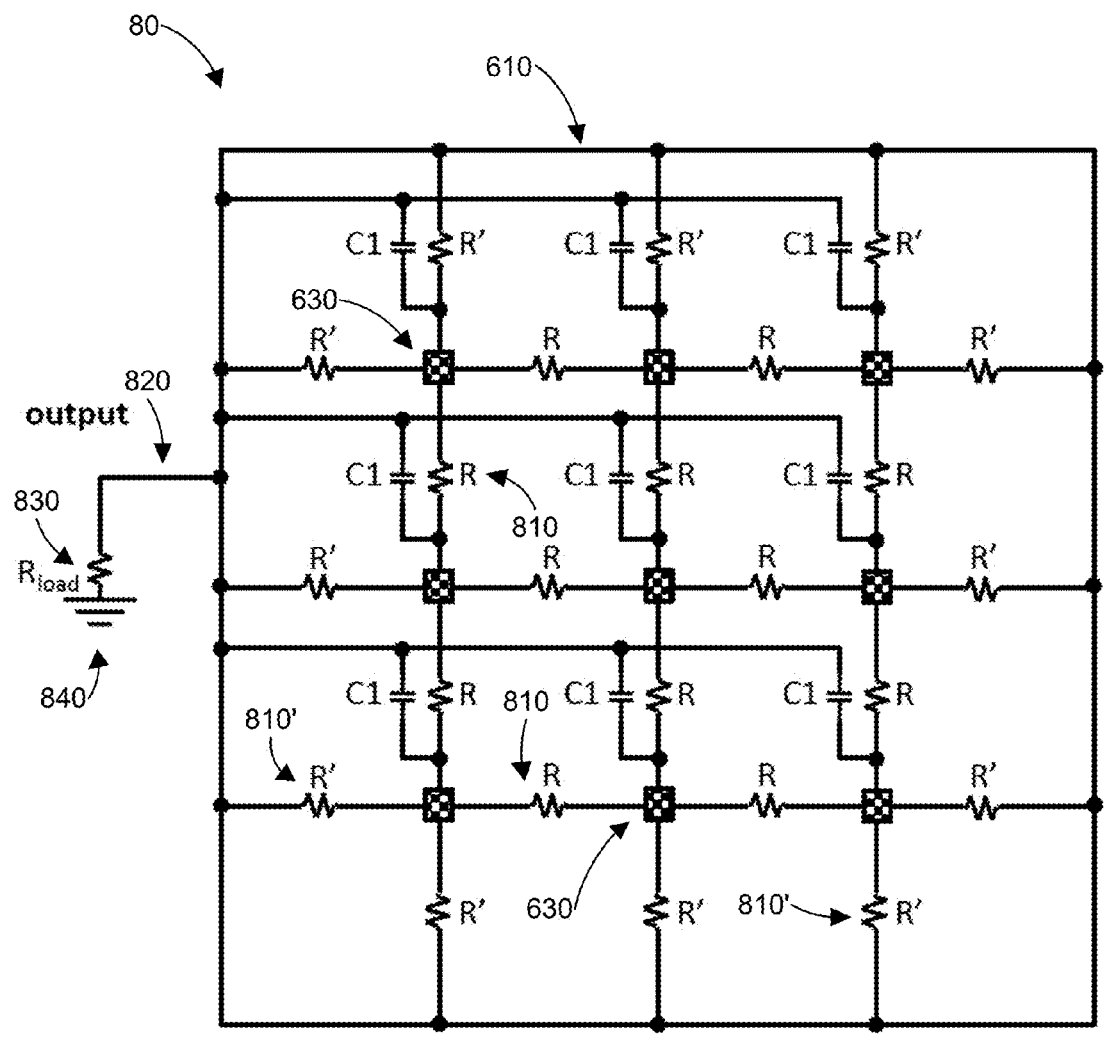
FIG. 8 is a circuit diagram for the SPAD array structure illustrated in FIGS. 6 and 7.

Contact metal ring 610 is deposited and patterned on heavily-doped p-type layer 603. The contact metal ring 610 is an elongated metal line that extends along the perimeter of the pixel array 60 as illustrated in FIG. 7. The contact metal ring 610 is in electrical communication with the output 820 (e.g., as illustrated in FIG. 8) of the photodetector. In some embodiments, contact metal ring 610 can also function as a guard contact (as described above).

A dielectric layer 640 is disposed on the exposed surface of p-type layer 603, the p-type layer, and the metal ring 610. In some embodiments, the dielectric layer 640 encapsulates p-type layer 603. The dielectric layer 640 can be formed of SiO2, Si3N4, Al2O3, and/or HfO2. Alternative dielectrics, as appreciated by those skilled in the art, can be used such as regrowth of wide band gap semiconductor layers such as AlInP, GaP, AlP, AlGaInN.

Metal lines 650A, 650B (generally, metal line(s) 650) are deposited and patterned on the dielectric layer 640 and above (e.g., centered above) each virtual mesa 620A, 620B. The metal line 650 is generally an elongated metal layer that is narrower than the virtual mesas 620A, 620B. The metal line 650 is electrically connected to the contact metal 610, as illustrated in FIG. 7. The metal line 650, the dielectric layer 640, and the virtual mesa 620A/620B forms capacitors C1 as shown in FIG. 8. The thickness and materials of the metal line 650, dielectric layer 640, and virtual mesa 620, and the dopant concentration of p-type layer 602 can affect the magnitude of the capacitance of C1. To provide efficient coupling of the SPAD current to the output ring 610, the capacitance of C1 can be between about 1/10 to about 10× the capacitance Cspad of each SPAD (e.g., Cspad 435). As discussed above, Cspad is the capacitor formed by the virtual mesa 620A/620B, the non-intentionally doped layer 601 and the heavily-doped n-type semiconductor layer 600, as described above.

A common cathode contact 680 is disposed below the heavily-doped n-type semiconductor layer 600, which functions as a common cathode connection to the SPAD array. A negative bias voltage Vbias between 10-200 V (or an voltage therebetween such as 25 V, 50 V, 75 V, 100 V, 125 V, 150 V, and 175 V) is applied between the cathode contact 680 and the contact metal ring 610. The negative bias voltage provides the necessary bias to achieve Geiger mode operation of the SPAD elements. The output signal is read out through the contact metal 610 (via the elongated metal line 650A, 650B).

It is noted that the common cathode contact 680 can be contacted from below (i.e., from the exposed surface distal from layer 600) or from above by etching through the top layers 601-603 to expose layer 600 for contact.

FIG. 7 illustrates a top view of the SPAD array structure 60 from FIG. 6. Line 7-6 illustrates the location of the cross section illustrated in FIG. 6. As illustrated, the contact ring 610 extends along the perimeter of pixels 630A, 630B, 630C, 630D. The elongated metal lines 650A, 650B extend from a first side 610A to an opposing second side 610B of the contact ring 610. Each metal line 650 includes at least one contact 675A, 675B to electrically connect the respective metal line 650A, 650B to the contact ring 610. Optional metal lines 650C, 650D are disposed orthogonally to the metal lines 650A, 650B. The metal lines 650C, 650D include respective contacts 675C, 675D to electrically connect to the ring 610. The metal lines 650C, 650D can be in the same plane or in a different plane than the metal lines 650A, 650B.

FIG. 8 is a simplified circuit diagram 80 for the cathode side of the SPAD array structure 60 described above. As illustrated in FIG. 8, each pixel 630 is electrically connected directly to the output 820 by a capacitor C1, while each pixel 630 is electrically connected to each adjacent pixel 630 by a resistor 810. Not that the parasitic capacitance C of resistor 810 is not illustrated in FIG. 8. The capacitor C1 represents the capacitor formed by the virtual mesa 620, the dielectric layer 640, and the metal line 650 as described above. The resistor 810 corresponds to the implanted region 402B disposed adjacent to each virtual mesa 820. The resistor 810 can be between about 0.1 to about 10 mega Ohms (MOhms) or an resistance therebetween such as 1 MOhm, 2 MOhms, 3 MOhms, 4 MOhms, 5 MOhms, 6 MOhms, 7 MOhms, 8 MOhms, and 9 MOhms. Each capacitor C1 is electrically connected to the contact ring 610, which in turn is electrically connected to an output 820. The output 820 is connected to a load resistor 830 and ground 840. Each pixel on the perimeter of the array 60 is electrically connected to the output (via contact metal 610) to output 820 through resistors 810' (labeled as R'). In general, resistor R' (resistor 810') will be similar to resistor R (resistor 810), though various designs considerations may allow the magnitude of resistor R' (resistor 810') to be somewhat different than resistor R (resistor 810).

The capacitor C1 and the connection of the capacitor C1 to the contact ring 610 causes a portion of the current pulse generated by an incident photon to go directly to the output 820. While another portion of the current pulse does travel to the adjacent SPADs through resistor 810 (and associated parasitic capacitor) between adjacent virtual mesa structures, the direct connection between capacitor C1 and contact ring 610 provides a low impedance path to output 820, providing a significant boost in the output 820 signal power compared to the case where capacitance of capacitor C1 is negligible or nonexistent. Therefore, a signal with a greater amplitude and a correspondingly greater signal to noise ratio can be achieved according to the disclosure.

An advantage to providing the contact ring 610 and the metal lines 650 is to eliminate the direct connection between the output and each resistor, which was required in the prior art. Also, the contact ring 610 does not need to be directly connected to each pixel 630 except at the perimeter of the array (via resistor 810' (R')). This reduces the complexity/cost of manufacturing and allows for a more compact configuration.

Figure 9:
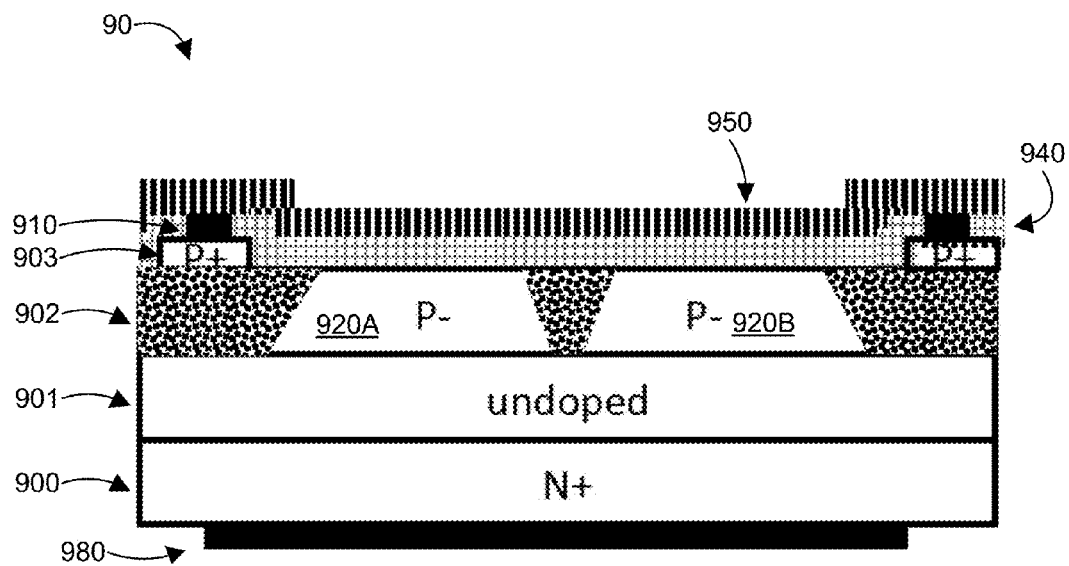
FIG. 9 illustrates an alternative embodiment of a SPAD array structure.

FIG. 9 illustrates an alternative embodiment of SPAD array structure described above. In SPAD array 90, a transparent conductor layer 950 is used in place of the metal line 650. The transparent conductor layer 950 is disposed on or above an optional dielectric layer 940. A capacitor C1' is formed by the transparent conductor layer 950, the optional dielectric layer 940, and the virtual mesa 920A/920B. The transparent conductor layer 950 can be formed from indium doped tin oxide (ITO), thin metal layers (i.e., less than 10 nm in thickness), organic conductors (e.g. polyaniline), carbon nanotubes, or other materials known to those skilled in the art. Transparent conductor 950 is connected to output contact 910, which is disposed on heavily-doped p-type layer 903.

An advantage to the embodiment illustrated in FIG. 9 is that the transparent conductor layer 950 does not block incident photons from passing into the virtual mesa 920 and, thus, no shadowing occurs. Also, the larger surface area of the transparent conductor layer 950 allows the capacitor C1' to have a larger capacitance (and therefore couple a larger portion of the SPAD signal to the output) than the capacitor C1 formed with the metal line 650, which has a smaller surface area. In addition, the gain of a SPAD device is determined by the total capacitance between the anode and cathode of the device, so C1 increases this total capacitance, enabling higher gain to be achieved, and hence higher gain to be achieved. A disadvantage to the embodiment illustrated in FIG. 9 is that the transparent conductor layer 950 absorbs between about 30% to 90% of incident photons, so there is a corresponding loss in detection sensitivity.

Layer 900 is a heavily doped n-type semiconductor layer, and functions as a common cathode connection to the SPAD array. Layer 901 is an optional undoped layer, designed to increase the width of the depletion region in the SPAD, allowing the device to operate at lower electrical field and therefore reduce unwanted tunneling currents. Layer 902 is the p-type side of the device, with the magnitude of the net p-type doping in layer 902 being less than the magnitude of the net n-type doping in layer 900. Layer 902 includes virtual beveled mesas 920A, 920B achieved by ion implantation as described above.

Figure 10:
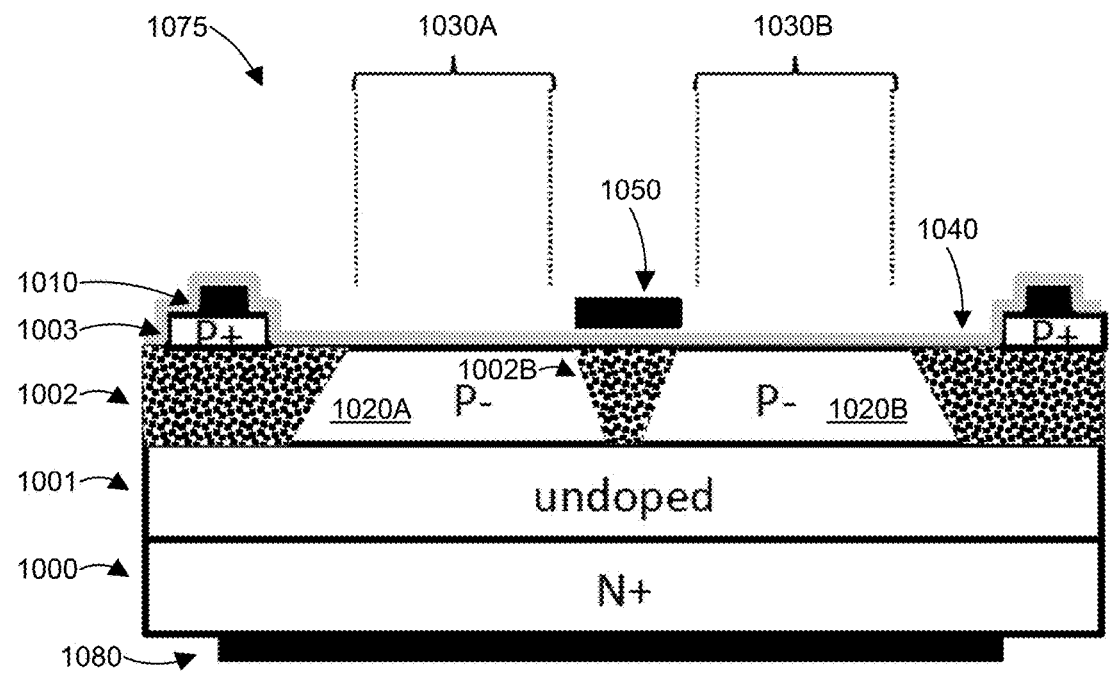
FIG. 10 illustrates an alternative embodiment of a SPAD array structure.

FIG. 10 illustrates an alternative embodiment of the SPAD array structure described above. In SPAD array 1075, a metal line 1050 is disposed over the space between adjacent pixels 1030A, 1030B (generally, pixels 1030). In other words, the metal line 1050 is disposed over the implanted region 1002B that defines adjacent virtual mesas 1020A, 1020B. Corresponding capacitors C1" are formed by the metal line 1050, the optional dielectric layer 1040, and each virtual mesa 920A, 920B (generally, virtual mesa 920).

Layer 1000 is a heavily doped n-type semiconductor layer, and functions as a common cathode connection to the SPAD array. Layer 1001 is an optional undoped layer, designed to increase the width of the depletion region in the SPAD, allowing the device to operate at lower electrical field and therefore reduce unwanted tunneling currents. Layer 1002 is the p-type side of the device, with the magnitude of the net p-type doping in layer 1002 being less than the magnitude of the net n-type doping in layer 1000. Layer 1002 includes virtual beveled mesas 1020A, 1020B achieved by ion implantation as described above. A common cathode contact 1080 is disposed below the heavily-doped n-type semiconductor layer 1000.

Figure 11:
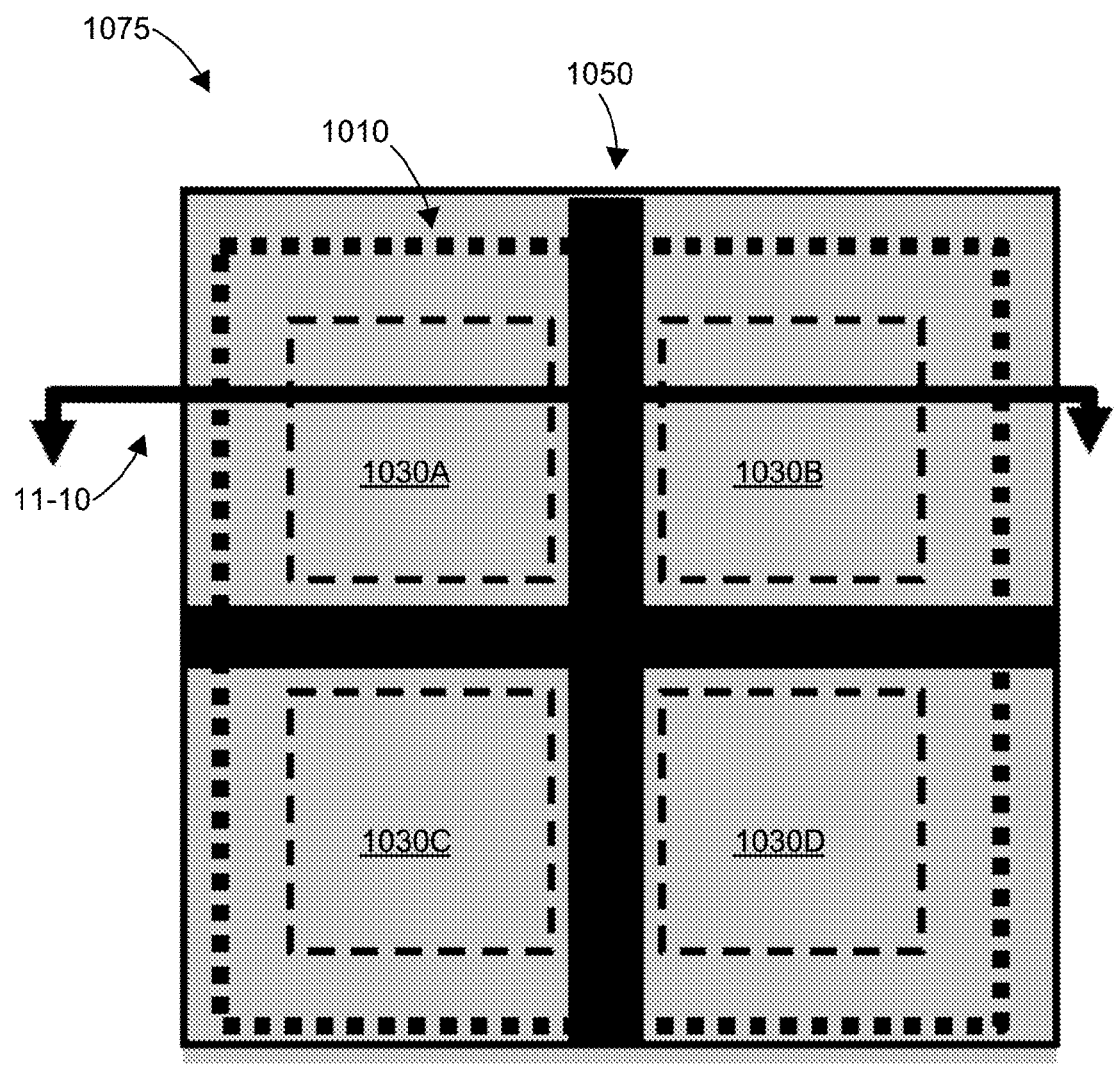
FIG. 11 illustrates a top view of the SPAD array structure illustrated in FIG. 10.

FIG. 11 illustrates a top view of the SPAD array 1010. As illustrated in FIG. 10, the metal line 1050 is vertically disposed over the empty space between adjacent pixels 1030A, 1030B, 1030C, 1030D (generally, 1030). Line 11-10 represents the area of cross-section illustrated in FIG. 10. Metal lines 1050 are electrically connected to the output contact 1010.

An advantage to the embodiment illustrated in FIGS. 10 and 11 is that the metal line 1050 does not block or shadow the pixels 1030 from incident photos. However, a disadvantage is that the capacitance of C1" is lower than the capacitance in other embodiments because the metal line 1050 and the virtual mesa 1020 are horizontally offset and there is little overlap in cross-sectional area of the respective plates.

Figure 12:
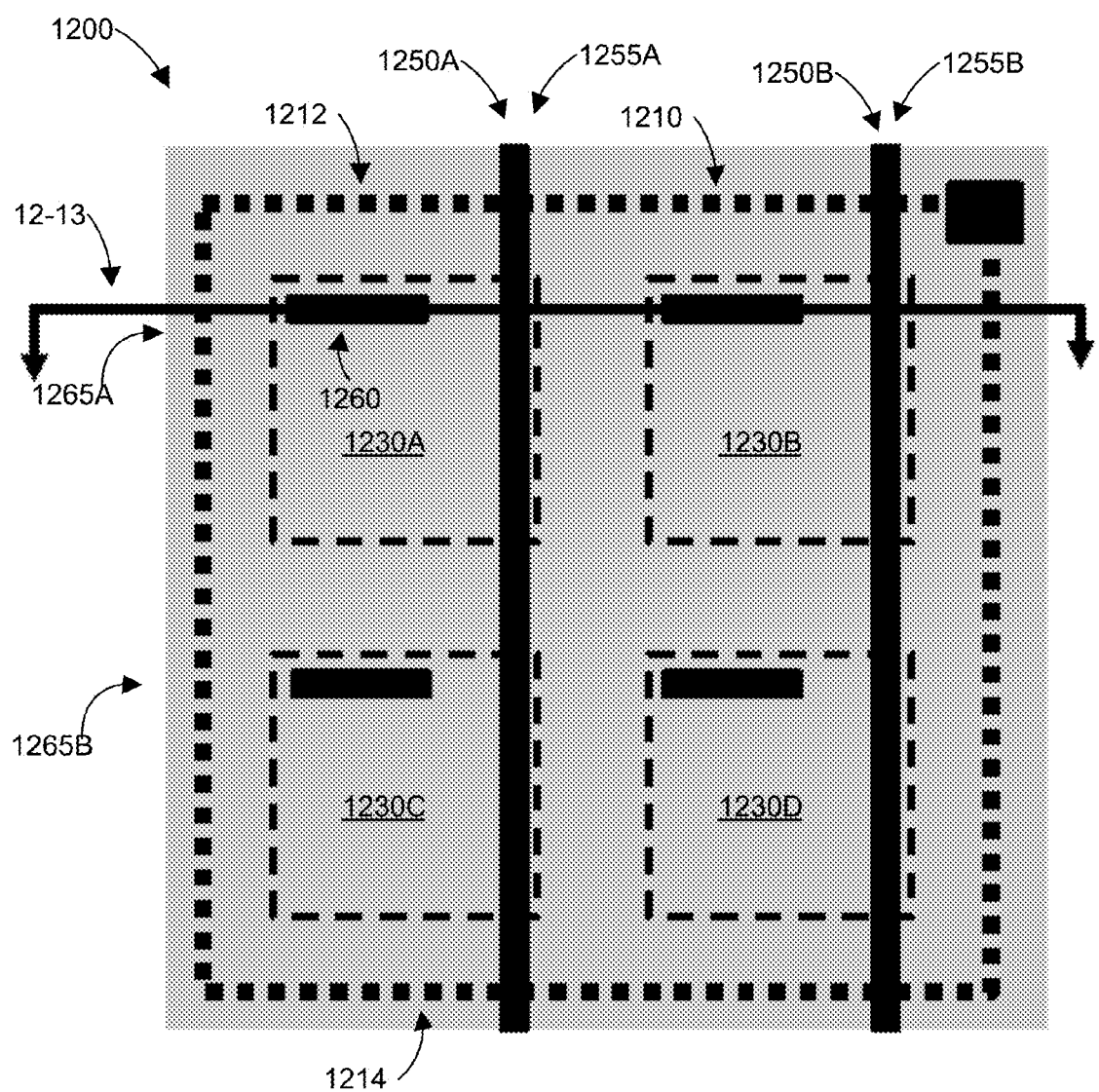
FIG. 12 illustrates a top view of a SPAD array structure according to an embodiment.

FIG. 12 is a top view of a SPAD array 1200 according to an embodiment. The SPAD array 1200 includes rows and columns of capacitor metals which provide for a row-column readout of individual pixels 1230 (e.g., pixels 1230A, 1230B, 1230C, 1230D). Metal column lines 1250A, 1250B (generally, column lines 1250) are disposed over respective columns of pixels 1230A, 1230C and pixels 1230B, 1230D. The column lines 1250 can be the same as or similar to the metal lines 450 described above. A row metal segment 1260 is disposed in each pixel in a second direction that is orthogonal to the first direction. The row segments 1260 are electrically connected to one another across a given row 1265.

All row quench capacitors in row 1 (e.g., row 1265A) are connected to a row 1 readout, and all the row quench capacitors in row 2 (e.g., row 1265B) are connected to row 2 readout (which is independent from row 1 readout), etc. for all rows of the array. Likewise all column quench capacitors in column 1 (e.g., column 1255A) are connected to column 1 readout, and all column quench capacitors in column 2 e.g., column 1255A) are connected to column 2 readout (which is independent of the other row and column readouts), etc. When a specific SPAD pixel is triggered (e.g., pixel 1230A), it capacitively couples a fixed charge pulse simultaneously onto its respective row and column readout lines. For example if the pixel in row 1 and column 2 is triggered, a simultaneous pulse will be detected on the row 1 readout line and the column 2 readout line. The row/column readout approach can simplify readout of a large N×M array, since only N columns and M rows need to be readout (instead of having an individual readout for all N×M pixels, and the readout electronics can be placed at the edges of the array, enabling increased complexity in the readout electronics compared to the case where there is an individual readout circuit adjacent to each pixel (if the readout electronics are monolithic), or behind each pixel (through die stacking). The disadvantage of the row/column readout is that it becomes difficult to isolate multiple simultaneous detection events. For example, two simultaneous detection events may trigger two row readouts and two column readouts, and therefore there is ambiguity in which 2 of the 4 possible SPADs at the intersection of the 2 rows and 2 columns have been triggered. For some applications, particularly light starved imaging, the disadvantage may be negligible.

Figure 13:
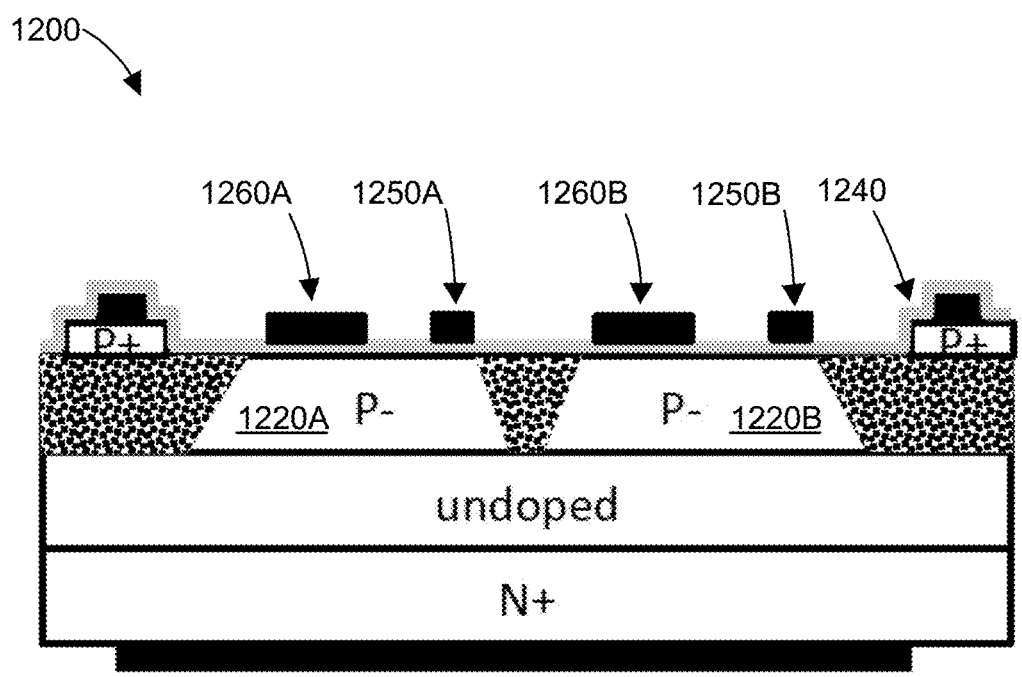
FIG. 13 illustrates a cross section of the SPAD array structure illustrated in FIG. 12.

FIG. 13 is a cross section of the SPAD array 1200 through the line 12-13. As illustrated, row segments 1260A, 1260B (generally, row segment 1260) and column line 1250A, 1250B are disposed over each virtual mesa 1220A, 1220B, respectively. Each row segment 1260 and column line 1250 forms a respective quench capacitor with the optional dielectric layer 1240 and virtual mesa 1220. The row and column capacitors are electrically disposed in parallel with each other.

Figure 14:
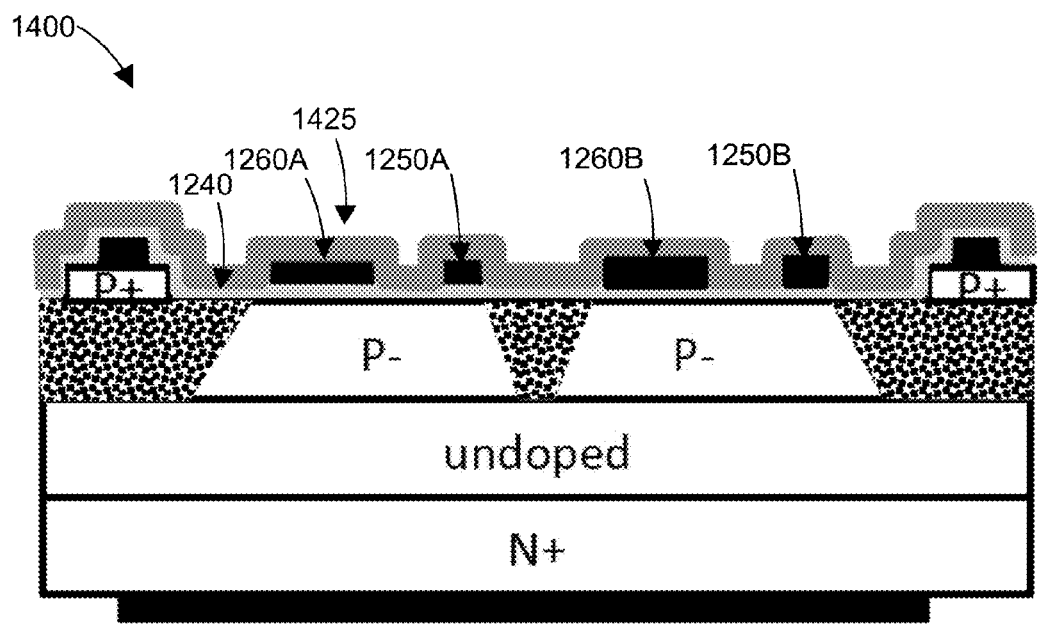
FIG. 14 is the SPAD array structure cross section illustrated in FIG. 13 showing a manufacturing step.

FIG. 14 is a cross section of SPAD array 1400 illustrating a manufacturing step of depositing a second, thick dielectric layer 1425 on the exposed surfaces of the SPAD array 1200 illustrated in FIG. 13. The dielectric layer 1425 can be at least as thick as dielectric layer 1240 (or dielectric 1040) from FIG. 13, and in some embodiments more than 10× as thick (or an range of thickness therebetween include 2× as thick, 4× as thick, 6× as thick, and 8× as thick). The dielectric layer 1240 can reduce the parasitic capacitance between the row and column readouts in a given pixel (e.g., the parasitic capacitance between row metal 1260A and column metal 1250A).

Figure 15:
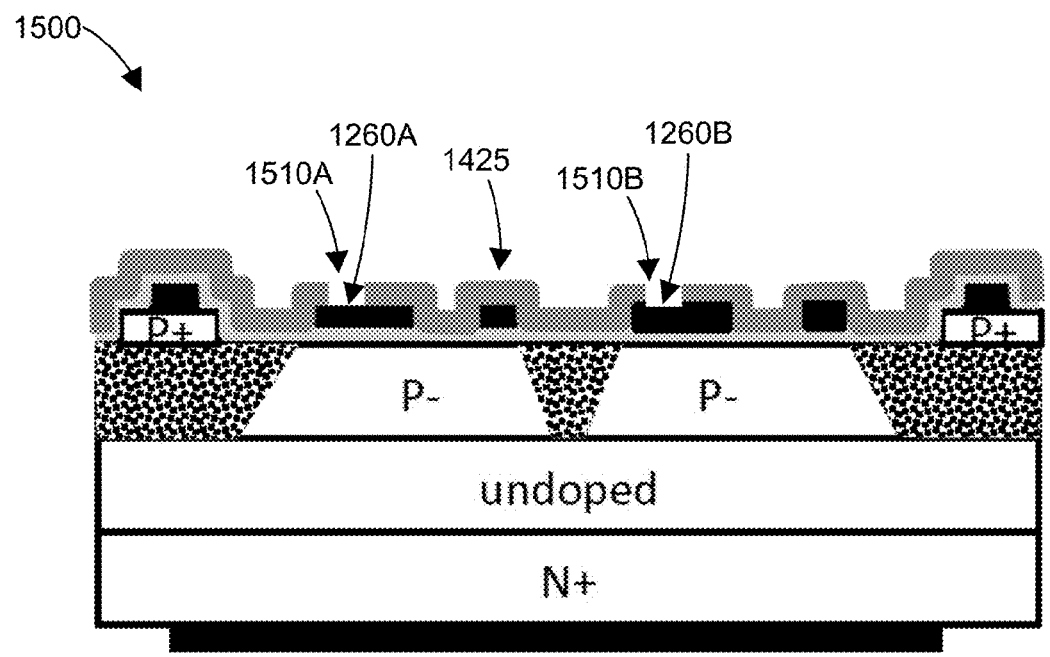
FIG. 15 is the SPAD array structure cross section illustrated in FIG. 14 illustrating a manufacturing step.
Figure 16:
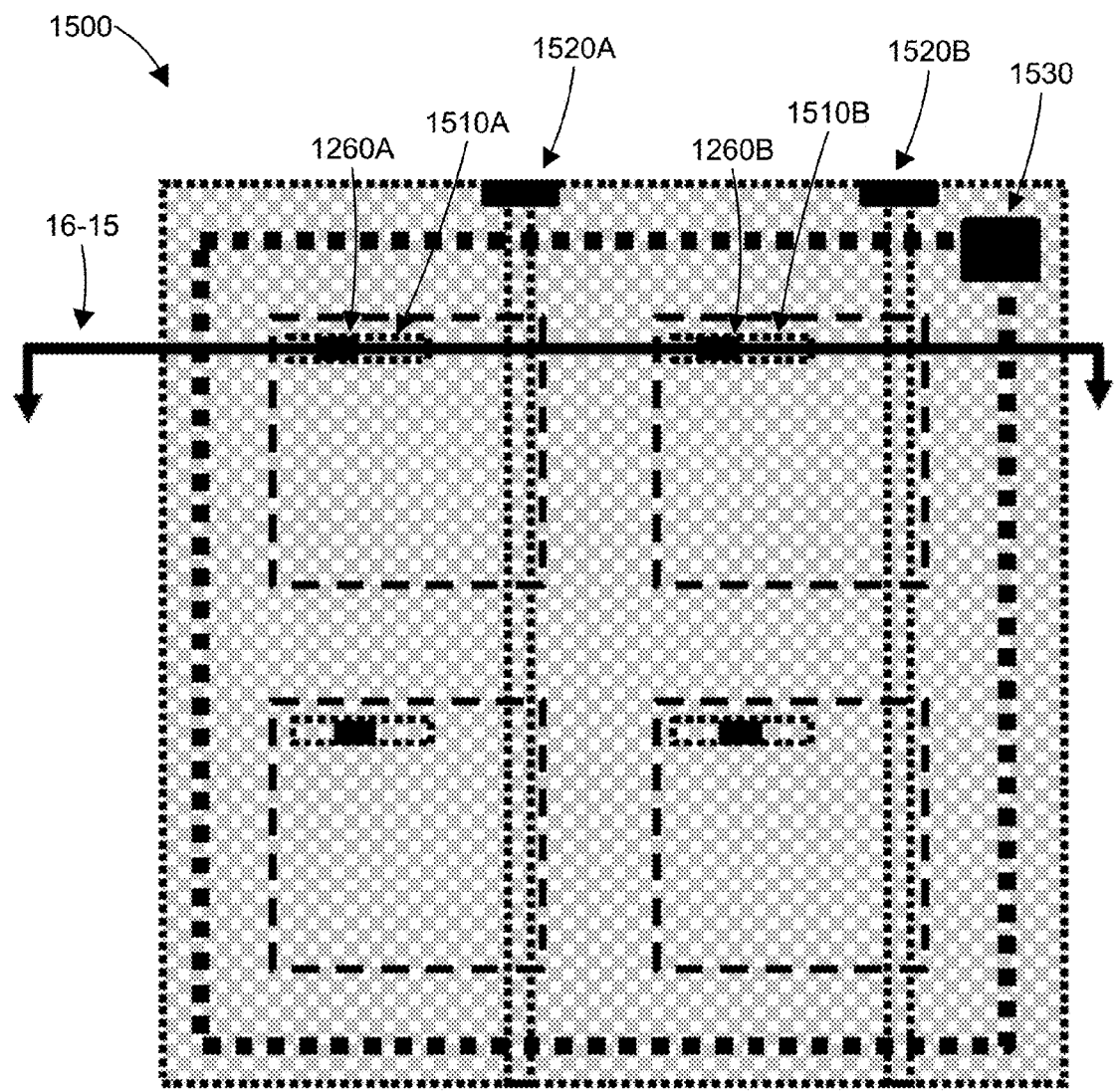
FIG. 16 illustrates a top view of the SPAD array structure illustrated in FIG. 15.

FIG. 15 is a cross section of SPAD array 1500 illustrating a manufacturing step of forming VIAs 1510A, 150B in the second dielectric layer 1425 to expose the row metals 1260A, 1260B, respectively. Column VIAs 1520A, 1520B are formed to the column readouts (as illustrated in FIG. 16), which were covered by the second dielectric layer 1425. An additional VIA 1530 is formed to expose the anode contact.

FIG. 16 is a top view of the SPAD array 1500 illustrating the VIAs 1510A, 1510B, 1520A, 1520B, and 1530. Line 16-15 represents the cross section for the structure illustrated in FIG. 15.

Figure 17:
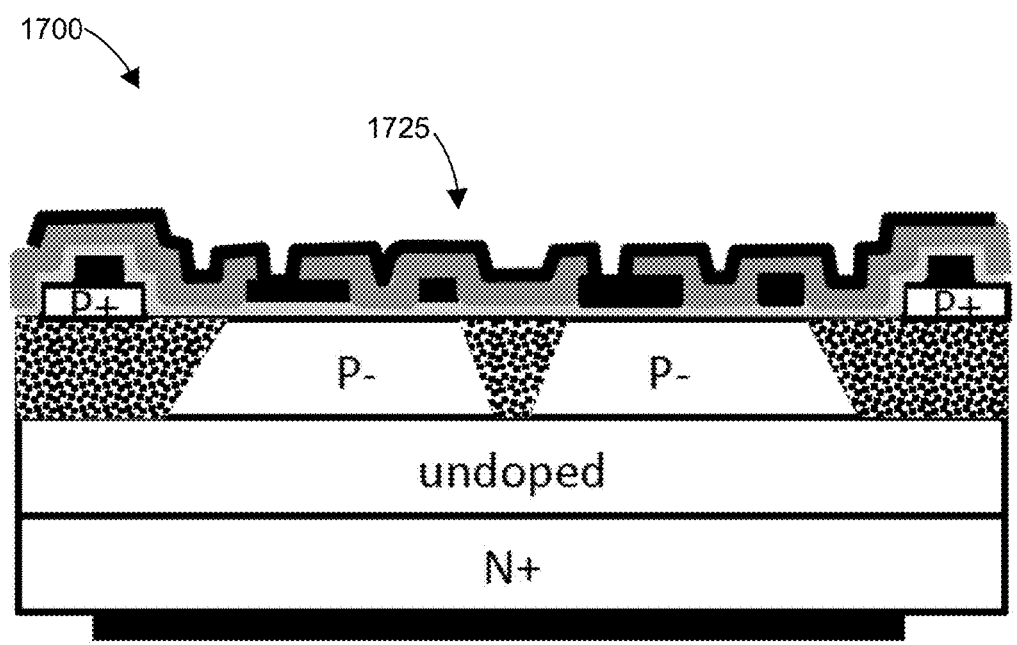
FIG. 17 is SPAD array structure cross section illustrated in FIG. 15 illustrating a manufacturing step.

FIG. 17 is a cross section of SPAD array 1700 illustrating a manufacturing step of depositing a metal 1725 on the second dielectric layer and the row metals 1260A, 1260B to connect the row metals to a row readout. Similar manufacturing steps are performed for each row in the array 1700.

Figure 18:
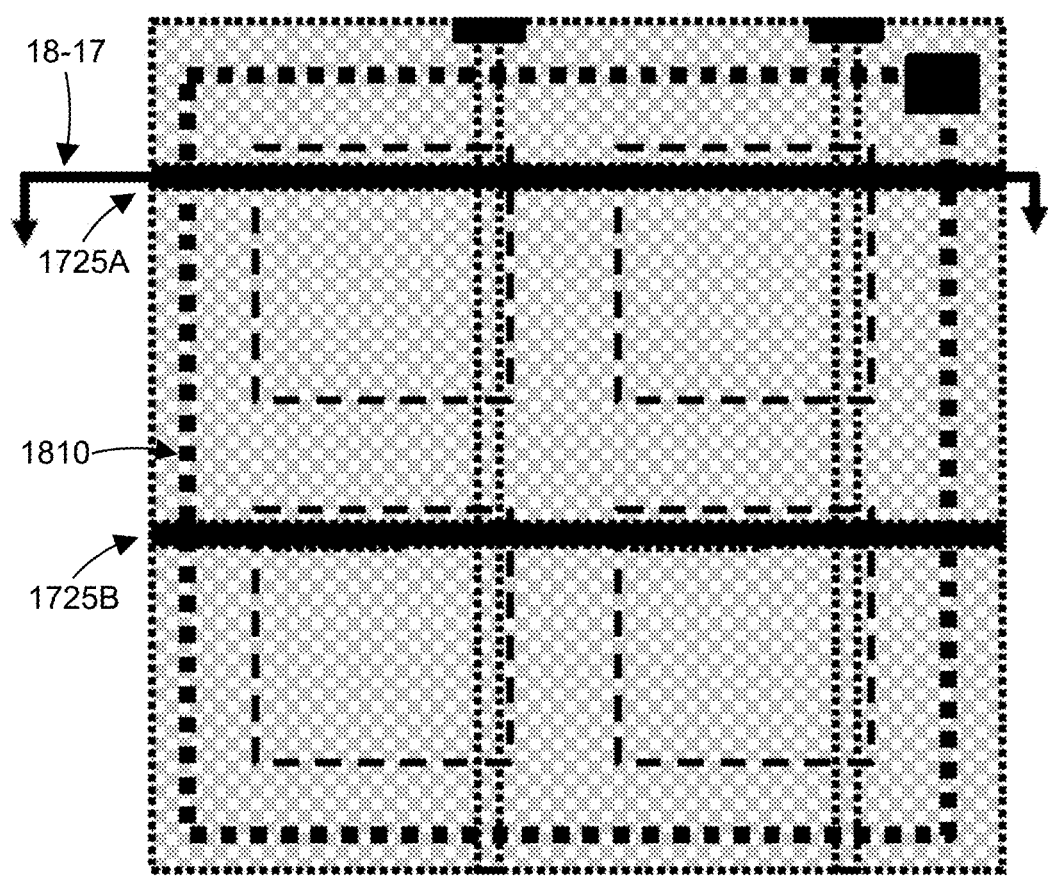
FIG. 18 illustrates a top view of the SPAD array structure illustrated in FIG. 17.

FIG. 18 is a top view of the SPAD array 1700 illustrating the deposited metal 1725A, 1725B across respective rows. The metals 1725, 1725B are connected to separate row readout circuits as discussed above.

Figure 19:
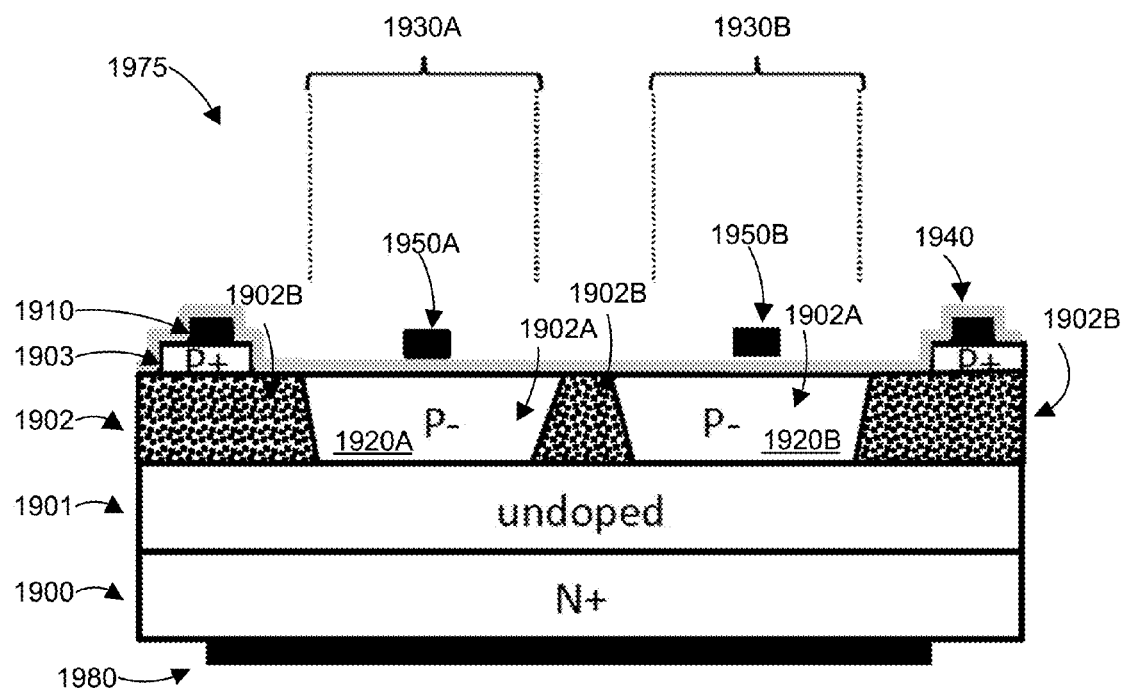
FIG. 19 illustrates a cross section of a SPAD array structure according to an embodiment.

FIG. 19 illustrates a cross section of an alternative embodiment of the SPAD array structures described above. As illustrated in FIG. 19, the SPAD array structure 1975 includes a heavily-doped n-type semiconductor layer 1900, an optional non-intentionally doped layer 1901, a lightly-doped p-type semiconductor layer 1902, and a patterned heavily doped p-type semiconductor portion 1903. The combination of layers 1902, 1901, and 1900 form a PIN diode structure for SPAD pixels 1930A, 1930B, though the layers can be inverted to form a NIP diode as discussed above. A common cathode contact 1980 is disposed below layer 1900. The SPAD array also includes contact metal 1910, dielectric layer 1940, and metal lines 1950A, 1950B as discussed above.

Layer 1902 includes regions 1902B that are isolation implanted with He+ ions as discussed above. The implanted regions 1902B define structures 1920A, 1920B in the unimplanted regions 1902A. It is noted that the depth of implanted regions 1902B can extend into the optional non-intentionally doped layer 1901 and/or the heavily-doped n-type semiconductor layer 1900. As illustrated in FIG. 19, the structures 1920A, 1920B have a negative bevel angle with respect to a normal of layer 1902. In other words, the cross-sectional width of the portion of the structure 1920A, 1920B that contacts dielectric layer 1940 is greater than the cross-sectional width of the structure 1920A, 1920B that contacts the optional non-intentionally doped layer 1901. The structure 1920A, 1920B can be formed by using a photoresist layer that has vertical sidewalls when performing ion implantation (which creates the implanted regions 1902B). The resulting structure 1920A, 1920B can have widened sidewalls having a negative angle (as discussed above and as illustrated in FIG. 19) or substantially vertical sidewalls (in addition to the tapered sidewalls having a positive angle, as discussed above). It is noted that the various forms of structure 1920A, 1920B can used in combination with any embodiments described above (e.g., transparent conductive layer, metal line disposed between the virtual mesa structures, line/column readout, etc.).

The present invention should not be considered limited to the particular embodiments described above, but rather should be understood to cover all aspects of the invention as fairly set out in the attached claims. Various modifications, equivalent processes, as well as numerous structures to which the present invention may be applicable, will be apparent to those skilled in the art to which the present invention is directed upon review of the present disclosure. The claims are intended to cover such modifications and equivalents

What is claimed is:

1. A photodetector array comprising:
    a substrate layer;
    a plurality of doped semiconductor layers including a first semiconductor layer doped with a first dopant disposed above said substrate and a second semiconductor layer doped with a second dopant disposed above said first semiconductor layer and proximal thereto;
    at least said second semiconductor layer being ion implanted in a plurality of selected regions thereof, said ion implants forming defined doped regions between adjacent selected regions; and
    a metal layer disposed above said second semiconductor layer, said metal layer in electrical communication with an output of said array,
    wherein said selected regions are implanted at positive lateral profile angles with respect to a normal to said second semiconductor layer so as to form a corresponding plurality of mesa structures having angled side profiles, each said mesa structure tapering to a narrowed cross-sectional width, said narrowed cross-sectional width in a direction orthogonal to said normal, and
    wherein said metal layer is an elongated metal line having a metal width less than a cross-sectional width of said selected regions, whereby each mesa structure and said metal layer form a first capacitor.

2. The photodetector of claim 1, wherein said selected regions have substantially vertical sidewalls.

3. The photodetector of claim 1, further comprising a dielectric layer disposed between said second semiconductor layer and said metal layer.

4. The photodetector of claim 3, wherein said metal layer, said dielectric layer, and selected region form a second capacitor.

5. The photodetector of claim 4, wherein said second capacitor has a first capacitance of between 10% and 1000% of the capacitance of a SPAD capacitor, said SPAD capacitor formed by said selected region and said second semiconductor layer.

6. The photodetector of claim 1, wherein said elongated metal layer is disposed above a center of said narrowed cross-sectional width of said mesa structure.

7. The photodetector of claim 1, wherein said metal layer is an elongated metal line having a metal width less than said narrowed cross-sectional width.

8. The photodetector of claim 1, further comprising a contact metal line disposed along a perimeter of said array, said contact metal line in electrical communication with said output and said metal layer.

9. The photodetector of claim 8, wherein said first capacitor is directly connected to said output.

10. A photodetector comprising:
    an array of pixels, each pixel comprising:
        a first doped semiconductor layer; and
        a first region and a second region of ion implants disposed in said first doped semiconductor layer, said first and second regions forming a defined doped region therebetween;
    a first capacitor comprising said defined doped region and a capacitor metal disposed above said first doped semiconductor layer; and
    a contact metal line electrically coupled to said capacitor and an output of said array.

11. The photodetector of claim 10, defined doped region is a virtual mesa.

12. The photodetector of claim 11, wherein said first and second regions are implanted at positive lateral profile angles with respect to a normal to said first doped semiconductor layer so as to form a corresponding plurality of mesa structures having angled side profiles, each said mesa structure tapering to a narrowed cross-sectional width, said narrowed cross-sectional width in a direction orthogonal to said normal.

13. The photodetector of claim 10, wherein said defined doped region has substantially vertical sidewalls.

14. The photodetector of claim 10, wherein said first and second regions are implanted at negative lateral profile angles with respect to a normal to said first doped semiconductor layer so as to form a corresponding plurality of inverse mesa structures having angled side profiles, each said inverse mesa structure expanding to a widened cross-sectional width, said widened cross-sectional width in a direction orthogonal to said normal.

15. The photodetector of claim 10, wherein said capacitor metal comprises a metal line.

16. The photodetector of claim 15, wherein a width of said metal line is less than a cross-sectional width of said defined doped region, said width of said capacitor metal line in a direction orthogonal to a normal to said metal line.

17. The photodetector of claim 10, wherein at least one of said first and second ion implanted regions is disposed between said defined doped region and an adjacent defined doped region.

18. The photodetector of claim 10, wherein said capacitor metal is disposed above said defined doped region.

19. The photodetector of claim 10, wherein said capacitor metal comprises a transparent conductor layer, said transparent conductor layer disposed above said virtual mesa and said first and second ion implanted regions.

20. The photodetector of claim 10, wherein said transparent conductor layer comprises at least one of indium doped tin oxide, graphene, carbon nanotubes, and conductive polymers.

21. The photodetector of claim 10, further comprising a dielectric layer disposed between said first doped semiconductor layer and said capacitor metal.

22. The photodetector of claim 10, wherein said contact metal line is electrically coupled to said capacitor metal.

23. The photodetector of claim 22, wherein said contact metal line is electrically coupled to said capacitor metal by a metal contact disposed in a VIA that extends from said contact metal line to said capacitor metal.

24. The photodetector of claim 10, further comprising a non-intentionally doped semiconductor layer disposed below said first doped semiconductor layer.

25. The photodetector of claim 24, further comprising a second doped semiconductor layer disposed below said non-intentionally doped semiconductor layer, said second doped semiconductor layer having a second charge carrier, said second charge carrier having an opposite polarity to a first charge carrier of the first doped semiconductor layer, wherein said first doped semiconductor layer, said non-intentionally doped semiconductor layer, and said second doped semiconductor layer comprises a PIN diode or a NIP diode.

26. The photodetector of claim 10, further comprising a second doped semiconductor layer disposed below said first doped semiconductor layer, said second doped semiconductor layer having a second charge carrier, said second charge carrier having an opposite polarity to a first charge carrier of the first doped semiconductor layer, wherein said first doped semiconductor layer and said second doped semiconductor layer comprises a PN diode or a NP diode.

27. The photodetector of claim 10, further comprising a patterned semiconductor layer disposed between said contact metal and said first or second region of ion implants, said patterned semiconductor layer comprising a third charge carrier having a same polarity as a first charge carrier of the first doped semiconductor layer.

28. The photodetector of claim 10, wherein said first capacitor has a first capacitance of between 10% and 1000% of a SPAD capacitance of a SPAD capacitor, said SPAD capacitor formed by said defined doped region and a common cathode contact disposed below said first doped semiconductor layer.

29. The photodetector of claim 10, wherein said capacitor metal comprises a row readout capacitor and a column readout capacitor for each pixel, wherein said row readout capacitor is electrically isolated from said column readout capacitor.

30. The photodetector array of claim 29 wherein the row readout capacitor is disposed orthogonally to said column readout capacitor.

31. The photodetector of claim 29, wherein each of said row readout capacitors in a row of the array is electrically connected to a row readout line, which provides connection to a row readout circuit and each of said column readout capacitors in a column of the array is electrically connected to a column readout line, which provides connection to a column readout circuit, wherein an active pixel in said array can be determined by monitoring said row and column readout circuits for coincident signal pulses.

32. The photodetector of claim 30, wherein row readout metal line is electrically connected to said first capacitor.

33. The photodetector of claim 30, wherein column readout metal line is electrically connected to said first capacitor.

34. The photodetector of claim 10, wherein said contact metal line is disposed above said first or second region of ion implants.

* * * * *